(12) United States Patent
Park et al.

(10) Patent No.: US 12,543,408 B2
(45) Date of Patent: Feb. 3, 2026

(54) DISPLAY DEVICE

(71) Applicant: Samsung Display Co., Ltd., Yongin-si (KR)

(72) Inventors: Do Yeong Park, Yongin-si (KR); Sung Jin Lee, Yongin-si (KR); Kyung Bae Kim, Yongin-si (KR); Ji Hye Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 813 days.

(21) Appl. No.: 17/450,060

(22) Filed: Oct. 5, 2021

(65) Prior Publication Data

US 2022/0131038 A1 Apr. 28, 2022

(30) Foreign Application Priority Data

Oct. 22, 2020 (KR) .................. 10-2020-0137836

(51) Int. Cl.
*H10H 20/819* (2025.01)
*H01L 25/075* (2006.01)
*H10H 20/83* (2025.01)

(52) U.S. Cl.
CPC ....... *H10H 20/819* (2025.01); *H01L 25/0753* (2013.01); *H10H 20/83* (2025.01)

(58) Field of Classification Search
CPC ..... H01L 33/20; H01L 33/36; H01L 25/0753; H10K 59/70; H10K 59/121; H10K 59/122; H10K 59/131; H10K 59/173; H10K 59/179; H10K 59/805; H10K 59/80515; H10K 59/80521; H10K 59/82; H10K 59/84; H10K 59/86; H10K 59/30
See application file for complete search history.

(56) References Cited

U.S. PATENT DOCUMENTS

| 10,249,603 B2 | 4/2019 | Cho et al. |
| 10,276,630 B2 | 4/2019 | Lee et al. |
| 10,340,419 B2 | 7/2019 | Kim et al. |

(Continued)

FOREIGN PATENT DOCUMENTS

| JP | 2005302712 A | * 10/2005 |
| KR | 10-2018-0007025 A | 1/2018 |

(Continued)

OTHER PUBLICATIONS

Machine Translation of JP2005302712A (Year: 2005).*

*Primary Examiner* — Yara B Green
*Assistant Examiner* — Fakeha Sehar
(74) *Attorney, Agent, or Firm* — Womble Bond Dickinson (US) LLP

(57) ABSTRACT

A display device including a plurality of pixels, each of the pixels including a first area and a second area and including: a first electrode and a second electrode in the first area; a plurality of light-emitting elements located between the first electrode and the second electrode in the first area; a first insulating layer in the first area and the second area; and a second insulating layer on the first insulating layer, wherein the first insulating layer includes a first opening in the second area, the second insulating layer includes a second opening overlapping the first opening, and a width of the first opening in a first direction is greater than a width of the second opening in the first direction.

20 Claims, 16 Drawing Sheets

(56) References Cited

U.S. PATENT DOCUMENTS

| | | | |
|---|---|---|---|
| 10,672,946 | B2 | 6/2020 | Cho et al. |
| 10,761,378 | B2 | 9/2020 | Hong et al. |
| 10,818,647 | B2 | 10/2020 | Kim et al. |
| 12,080,830 | B2 | 9/2024 | Lee et al. |
| 2017/0005155 | A1* | 1/2017 | You .................. H01L 21/32133 |
| 2017/0104009 | A1 | 4/2017 | Peng et al. |
| 2018/0034000 | A1* | 2/2018 | Lee ...................... H10K 59/121 |
| 2018/0136527 | A1* | 5/2018 | Park .................. G02F 1/136227 |
| 2018/0175104 | A1* | 6/2018 | Kang .................... H01L 33/005 |
| 2019/0198811 | A1* | 6/2019 | Choi ...................... H10K 59/88 |
| 2019/0244985 | A1* | 8/2019 | Kim .................. H10H 20/8316 |
| 2019/0251898 | A1* | 8/2019 | Cho .................... H10H 20/819 |
| 2019/0319168 | A1* | 10/2019 | Kim ........................ H01L 33/50 |
| 2020/0020741 | A1 | 1/2020 | Woo |
| 2020/0411492 | A1* | 12/2020 | Ju ........................ H10H 20/857 |
| 2021/0202608 | A1* | 7/2021 | Lee ...................... H10K 59/131 |
| 2021/0265324 | A1 | 8/2021 | Kong et al. |
| 2022/0130810 | A1 | 4/2022 | Park et al. |

FOREIGN PATENT DOCUMENTS

| | | |
|---|---|---|
| KR | 10-2018-0007376 A | 1/2018 |
| KR | 10-2018-0009014 A | 1/2018 |
| KR | 10-2018-0011404 A | 2/2018 |
| KR | 10-2019-0062654 A | 6/2019 |
| KR | 10-1987196 B1 | 6/2019 |
| KR | 10-2020-0008075 A | 1/2020 |
| KR | 10-2020-0010706 A | 1/2020 |
| KR | 10-2020-0021014 A | 2/2020 |
| KR | 10-2020-0088961 A | 7/2020 |
| KR | 10-2022-0053765 A | 5/2022 |
| WO | WO 2020/209484 A1 | 10/2020 |

\* cited by examiner

DISPLAY DEVICE

CROSS-REFERENCE TO RELATED APPLICATION

This application claims priority to and the benefit of Korean Patent Application No. 10-2020-0137836 filed in the Korean Intellectual Property Office on Oct. 22, 2020, the entire content of which is incorporated herein by reference.

BACKGROUND

1. Field

The present disclosure relates to a display device.

2. Description of the Related Art

Recently, as interest in information displays is increasing, research and development for display devices are continuously being conducted.

SUMMARY

An embodiment of the present disclosure provides a display device capable of improving luminous efficiency and reducing or minimizing short circuit defects and/or foreign material defects.

The aspects of the embodiments of the present disclosure are not limited to the features and aspects described above, and other features and aspects not described above will be obvious to the persons having an ordinary skill in the art in this field from the following descriptions.

A display device according to one embodiment includes a plurality of pixels, each of the pixels including a first area and a second area and comprising: a first electrode and a second electrode in the first area; a plurality of light-emitting elements located between the first electrode and the second electrode in the first area; a first insulating layer in the first area and the second area; and a second insulating layer on the first insulating layer, wherein the first insulating layer includes a first opening in the second area, wherein the second insulating layer includes a second opening overlapping the first opening, and wherein a width of the first opening in a first direction is greater than a width of the second opening in the first direction.

The display device may further include a bank surrounding the first area and the second area.

The first area may include a first emission area and a second emission area, and the second area may be located between the first emission area and the second emission area.

The second area may be a non-emission area.

The display device may further include an ineffective light-emitting element in the second area.

The light-emitting elements may be effective light sources, and the ineffective light-emitting element may be an ineffective light source.

The second insulating layer may at least partially cover the ineffective light-emitting element.

The ineffective light-emitting element may be in the first opening.

In order to solve the above problem, a display device according to another embodiment includes a first emission area, a second emission area, and a non-emission area located between the first emission area and the second emission area; a first electrode and a second electrode in the first emission area; a plurality of first light-emitting elements located between the first electrode and the second electrode; a third electrode and a fourth electrode in the second emission area; a plurality of second light-emitting elements located between the third electrode and the fourth electrode; at least one contact electrode electrically connecting one of the first electrode and the second electrode and one of the third electrode and the fourth electrode; and an insulating layer in the first emission area, the second emission area, and the non-emission area, wherein the insulating layer includes an opening area in the non-emission area.

The opening area may include a first opening area between the first electrode and the third electrode; and a second opening area between the second electrode and the fourth electrode.

A width of the first opening area in a first direction may be greater than a width of the second opening area in the first direction.

The plurality of first light-emitting elements and the plurality of second light-emitting elements may be connected in series.

The insulating layer may include a first insulating layer; and a second insulating layer on the first insulating layer.

The first insulating layer may include a first opening overlapping the opening area, and the second insulating layer may include a second opening overlapping the first opening.

A width of the first opening in a first direction may be greater than a width of the second opening in the first direction.

The display device may further include an ineffective light-emitting element in the opening area.

The plurality of first light-emitting elements and the plurality of second light-emitting elements may be effective light sources, and the ineffective light-emitting element may be an ineffective light source.

The second insulating layer may at least partially cover the ineffective light-emitting element.

The ineffective light-emitting element may be in the first opening.

The display device may further include a bank surrounding the first emission area, the second emission area, and the non-emission area.

Other details of the embodiments are included in the detailed description and the drawings.

DETAILED DESCRIPTION

Figure 1:
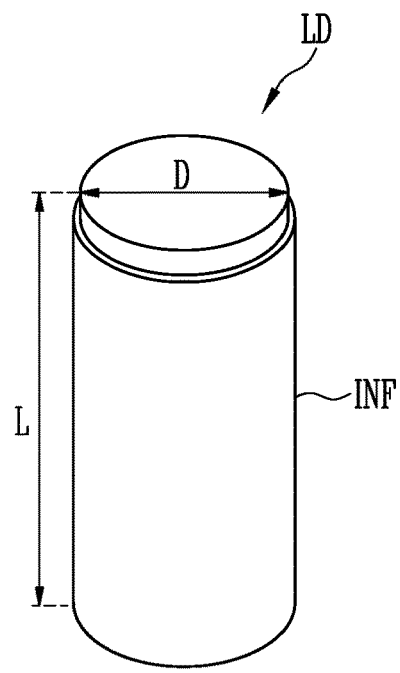
FIGS. 1 and 2 are a perspective view and a cross-sectional view illustrating a light-emitting element according to one embodiment.

The features and aspects of embodiments of the present disclosure and methods of achieving the features and aspects of the embodiments of the present disclosure will be described more fully with reference to the accompanying drawings, in which embodiments of the present disclosure are shown. However, the scope of the present disclosure is not limited to the embodiments set forth herein and the present disclosure may be realized in various suitable forms. The embodiments are merely provided to make the present disclosure complete and to make those having ordinary skill in the art to which the present disclosure pertains completely understand the scope of the present disclosure. The present disclosure is defined only by the scope of the claims, and their equivalents.

The terms used in the present disclosure are for explaining the embodiments rather than limiting the present disclosure. As used herein, the singular forms "a," "an" and "the" are intended to include the plural forms as well, unless the context clearly indicates otherwise. It will be further understood that the terms "comprises," "comprising," "includes," and/or "including," if used herein, specify the presence of stated components, steps, operations, and/or elements, but do not preclude the presence or addition of one or more other components, steps, operations, and/or elements.

Further, the term "connection" or "coupling" may mean a physical and/or electrical connection or coupling. Furthermore, the term may mean a direct or indirect connection or coupling and an integral or non-integral connection or coupling.

It will be understood that when an element or a layer is referred to as being "on" or "above" another element or layer, it can be directly on or above another element or layer or intervening elements or layers may be present. Like reference numerals refer to like elements throughout the present disclosure.

It should be understood that, although terms such as "first," "second," and the like may be used herein to describe various components, these components are not limited by these terms. These terms are only used to distinguish one element or component from another element or component. Therefore, a first component described below could be termed a second component without departing from the scope and spirit of the present disclosure.

Hereinafter, embodiments of the present disclosure will be described in detail with reference to the accompanying drawings.

Figure 2:
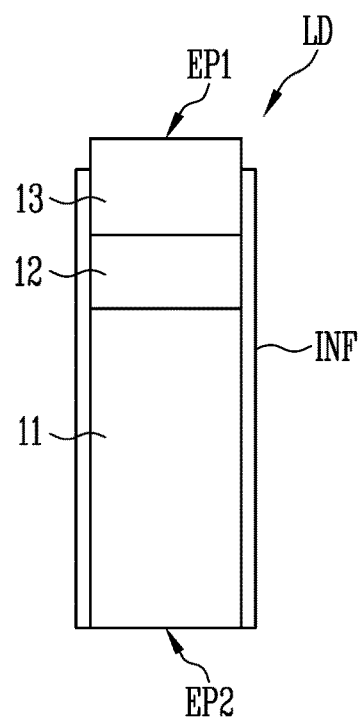
Figure 3:
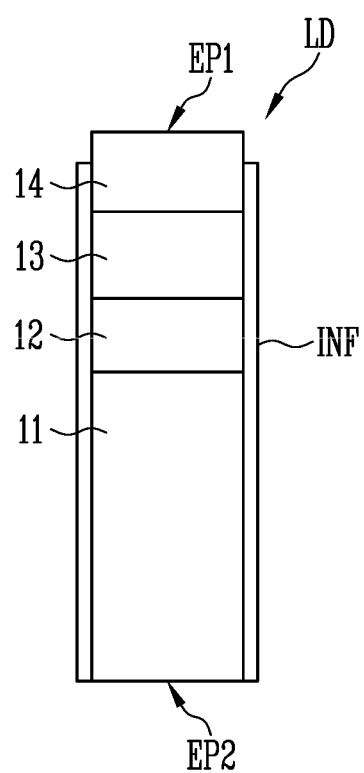
FIGS. 3 and 4 are cross-sectional views illustrating light-emitting elements according to other embodiments.
Figure 4:
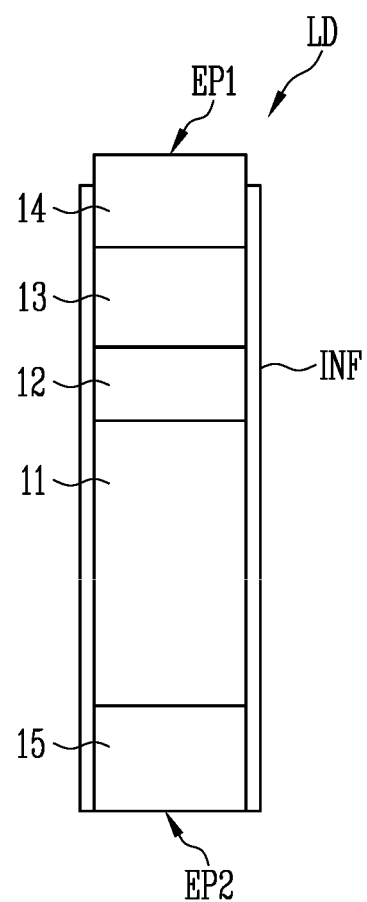

FIGS. 1 and 2 are a perspective view and a cross-sectional view illustrating a light-emitting element according to one embodiment. FIGS. 3 and 4 are cross-sectional views illustrating light-emitting elements according to other embodiments.

Rod-shaped light-emitting elements LD having a circular columnar shape are illustrated in FIGS. 1-4, but the types and/or shapes of the light-emitting elements LD according to the present disclosure are not limited thereto.

Referring to FIGS. 1-4, the light-emitting element LD may include a first semiconductor layer 11, a second semiconductor layer 13, and an active layer 12 interposed between the first semiconductor layer 11 and the second semiconductor layer 13. As an example, when it is assumed that an extending direction of the light-emitting element LD is a direction of a length L, the light-emitting element LD may include the first semiconductor layer 11, the active layer 12, and the second semiconductor layer 13 which are sequentially stacked in the direction of the length L.

The light-emitting element LD may be provided in a rod-like shape extending in one direction. The light-emitting element LD may have a first end portion EP1 and a second end portion EP2. One of the first and second semiconductor layers 11 and 13 may be disposed at the first end portion EP1 of the light-emitting element LD. The other one of the first and second semiconductor layers 11 and 13 may be disposed at the second end portion EP2 of the light-emitting element LD.

According to some embodiments, the light-emitting element LD may be a rod-shaped light-emitting element (also referred to as a "rod-shaped light-emitting diode") manufactured in a rod-like shape through an etching method or the like. In the present disclosure, the term "rod-like shape" includes all of a rod-like shape and a bar-like shape, such as a circular column and a polygonal column, which are long in the direction of the length L (i.e., have an aspect ratio greater than one). A shape of a cross section of the rod-like shape is not particularly limited. For example, the length L1 of the light-emitting element LD may be greater than a diameter D (or width of a cross section) thereof.

The light-emitting element LD may have a small size ranging from a nanometer scale to a micrometer scale. As an example, the light-emitting element LD may have the diameter D (or width) and/or the length L which ranges from a nanometer scale to a micrometer scale. However, the size of the light-emitting element LD is not limited thereto. The size of the light-emitting element LD may be variously changed according to design conditions of various devices, for example, a display device which uses a light-emitting device including the light-emitting element LD as a light source.

The first semiconductor layer 11 may be a first-conductivity type semiconductor layer. For example, the first semiconductor layer 11 may include an N-type semiconductor layer. As an example, the first semiconductor layer 11 may include an N-type semiconductor layer which includes any one semiconductor material selected from InAlGaN, GaN, AlGaN, InGaN, AlN, and InN and is doped with a first-conductivity type dopant such as silicon (Si), germanium (Ge), tin (Sn), or the like. However, a material constituting the first semiconductor layer 11 is not limited thereto, and the first semiconductor layer 11 may be made of various materials.

The active layer 12 may be disposed on the first semiconductor layer 11 and may be formed to have a single-quantum well or multi-quantum well structure. The position of the active layer 12 may be variously changed according to the type of the light-emitting element LD. The active layer 12 may emit light having a wavelength of 400 nm to 900 nm and may have a double hetero-structure.

A clad layer doped with a conductive dopant may be formed on and/or under the active layer 12. As an example, the clad layer may be formed as an AlGaN layer or an InAlGaN layer. According to some embodiments, a material such as AlGaN or AlInGaN may be used to form the active layer 12. Further, the active layer 12 may be made of various materials.

The second semiconductor layer 13 may be disposed on the active layer 12 and may include a semiconductor layer which is a different type from the first semiconductor layer 11. For example, the second semiconductor layer 13 may include a P-type semiconductor layer. As an example, the second semiconductor layer 13 may include a P-type semiconductor layer which includes any one semiconductor material selected from InAlGaN, GaN, AlGaN, InGaN, AlN, and InN and is doped with a second-conductivity type dopant such as magnesium (Mg). However, a material constituting the second semiconductor layer 13 is not limited thereto, and the second semiconductor layer 13 may be made of various materials.

As an example, the first semiconductor layer 11 and the second semiconductor layer 13 may have different lengths (or thicknesses) in the direction of the length L of the light-emitting element LD. As an example, the first semiconductor layer 11 may have a length (or thickness) that is relatively greater than that of the second semiconductor layer 13 in the direction of the length L of the light-emitting element LD. Accordingly, the active layer 12 of the light-emitting element LD may be positioned closer to the first end portion EP1 at the exposed end of the second semiconductor layer 13 than to the second end portion EP2 at the exposed end of the first semiconductor layer 11.

When a voltage greater than or equal to a threshold voltage is applied between both end portions of the light-emitting element LD, electrons and holes are combined with each other in the active layer 12, and thus, the light-emitting elements LD emits light. By controlling light emission of the light-emitting element LD using such a principle, the light-emitting element LD may be used as a light source of various light-emitting devices including pixels of a display device.

The light-emitting element LD may further include an insulating film INF provided on a surface thereof (e.g., an outer peripheral surface of the light-emitting element LD). The insulating film INF may be formed on the surface of the light-emitting element LD so as to surround an outer peripheral surface of the active layer 12 at least. Further, the insulating film INF may further surround one area (e.g., an outer peripheral surface) of the first and second semiconductor layers 11 and 13.

According to some embodiments, the insulating film INF may expose both end portions EP1 and EP2 of the light-emitting element LD which have different polarities. For example, the insulating film INF may expose one ends of the first and second semiconductor layers 11 and 13 positioned at both end portions EP1 and EP2 of the light-emitting element LD in a length direction thereof, for example, two planar surfaces (this is, an upper surface and a lower surface) of a cylinder without covering the one ends. In some other embodiments, the insulating film INF may expose both end portions EP1 and EP2 of the light-emitting element LD having different polarities and side portions of the semiconductor layers 11 and 13 adjacent to the both end portions EP1 and EP2.

According to some embodiments, the insulating film INF may be formed as a single-layer or a multi-layer including at least one insulating material selected from silicon oxide ($SiO_x$), silicon nitride ($SiN_x$), aluminum oxide ($AlO_x$), and titanium oxide ($TiO_x$) (for example, a double layer made of aluminum oxide ($AlO_x$) and silicon oxide ($SiO_x$)), but the present disclosure is not necessarily limited thereto. According to some embodiments, the insulating film INF may be omitted.

When the insulating film INF is provided to cover the surface of the light-emitting element LD, for example, the outer peripheral surface of the active layer 12, it is possible to prevent or protect the active layer 12 from being short-circuited with a first pixel electrode or second pixel electrode to be described below. Accordingly, electrical stability of the light-emitting element LD may be secured.

Further, when the insulating film INF is provided on the surface of the light-emitting element LD, surface defects of the light-emitting element LD may be reduced or minimized, thereby improving a lifetime and efficiency of the light-emitting element LD. Also, even when a plurality of light-emitting elements LD are disposed close to each other, an undesirable short circuit may be prevented from occurring between adjacent light-emitting elements LD.

In one embodiment, the light-emitting element LD may further include an additional component in addition to the first semiconductor layer 11, the active layer 12, the second semiconductor layer 13, and/or the insulating film INF surrounding the first semiconductor layer 11, the active layer 12, and the second semiconductor layer 13. For example, the light-emitting element LD may additionally include at least one fluorescent layer, active layer, semiconductor layer, and/or electrode layer disposed at one end sides of the first semiconductor layer 11, the active layer 12, and/or the second semiconductor layer 13.

For example, as illustrated in FIG. 3, the light-emitting element LD may further include an electrode layer 14 disposed at one end side of the second semiconductor layer 13. In this case, the electrode layer 14 may be positioned at the first end portion EP1 of the light-emitting element LD.

In some embodiments, as illustrated in FIG. 4, the light-emitting element LD may further include another electrode layer 15 disposed at one end side of the first semiconductor layer 11. As an example, the electrode layers 14 and 15 may be disposed at the first and second end portions EP1 and EP2 of the light-emitting element LD, respectively. The electrode layers 14 and 15 may be ohmic contact electrodes but are not limited thereto. For example, the electrode layers 14 and 15 may be Schottky contact electrodes. Further, the electrode layers 14 and 15 may include a metal or a metal oxide. As an example, the first and second electrode layers 14 and 15 may be made of at least one selected from chromium (Cr), titanium (Ti), aluminum (Al), gold (Au), nickel (Ni), an oxide or alloy thereof, and indium tin oxide (ITO), or a mixture thereof. Materials included in each of the electrode layers 14 and 15 may be the same or different. The electrode layers 14 and 15 may be substantially transparent or translucent. Accordingly, light generated in the light-emitting element LD may pass through the electrode layers 14 and 15 and may be emitted to the outside of the light-emitting element LD. In another embodiment, when the light generated by the light-emitting element LD does not pass through the electrode layers 14 and 15 and is emitted to the outside of the light-emitting element LD through an area excluding both end portions of the light-emitting element LD, the electrode layers 14 and 15 may include an opaque metal.

Figure 5:
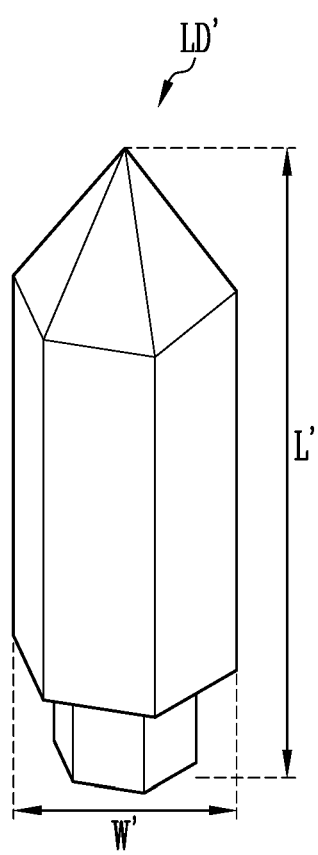
FIGS. 5 and 6 are a perspective view and a cross-sectional view illustrating a light-emitting element according to another embodiment.
Figure 6:
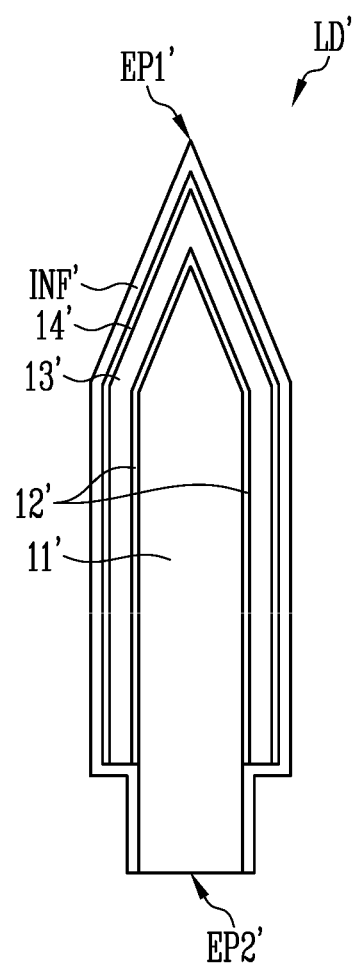

FIGS. 5 and 6 are a perspective view and a cross-sectional view illustrating a light-emitting element according to another embodiment.

According to some embodiments, FIGS. 5 and 6 illustrate a light-emitting element LD' having a structure different from that of the light-emitting elements LD illustrated in FIGS. 1-4, for example, a light-emitting element having a core-shell structure. That is, the type, structure, and/or shape of the light-emitting element LD/LD' may be variously changed. In the embodiment of FIGS. 5 and 6, components similar or identical to those of the embodiments of FIGS. 1-4 (for example, corresponding components) may be denoted by the same reference numerals, and detailed descriptions thereof may be omitted.

Referring to FIGS. 5 and 6, the light-emitting element LD' includes a first semiconductor layer 11', a second semiconductor layer 13', and an active layer 12' interposed between the first semiconductor layer 11' and the second semiconductor layer 13'. According to some embodiments, the first semiconductor layer 11' may be disposed in a central area of the light-emitting element LD', and the active layer 12' may be disposed on a surface (e.g., an outer peripheral surface) of the first semiconductor layer 11' so as to cover at least one area of the first semiconductor layer 11'. The second semiconductor layer 13' may be disposed on a surface (e.g., an outer peripheral surface) of the active layer 12' so as to surround at least one area of the active layer 12'.

In some embodiments, the light-emitting element LD' may further include an electrode layer 14' surrounding at least one area (e.g., an outer peripheral surface) of the second semiconductor layer 13' and/or an insulating film INF' may be disposed on an outermost surface (e.g., an outer peripheral surface) of the light-emitting element LD'. For example, the light-emitting element LD' may further include the electrode layer 14' disposed on a surface (e.g., an outer peripheral surface) of the second semiconductor layer 13' so as to surround at least one area of the second semiconductor layer 13' and the insulating film INF' disposed on a surface (e.g., an outer peripheral surface) of the electrode layer 14' so as to surround at least one area of the electrode layer 14'.

According to some embodiments, the insulating film INF' may be provided on the surface (e.g., an outer peripheral surface) of the light-emitting element LD' so as to cover a portion of an outer peripheral surface of the first semiconductor layer 11' and an outer peripheral surface of the electrode layer 14'. In one embodiment, after the insulating film INF' may be first formed to cover the entire outer peripheral surface of the electrode layer 14' included in the light-emitting element LD', the insulating film INF' may be partially removed to expose one area of the electrode layer 14' in order for the electrode layer 14' to be electrically connected to a pixel electrode ELT (see FIG. 8 and the like). The insulating film INF' may include a transparent insulating material.

The light-emitting element LD' may be a light-emitting element having a core-shell structure (also referred to as a "core-shell light-emitting diode") manufactured through a growth method or the like. For example, the light-emitting element LD' may have a core-shell structure including the first semiconductor layer 11', the active layer 12', the second semiconductor layer 13', the electrode layer 14', and the insulating film INF' which are sequentially disposed outward from a center (or central region) thereof. In some embodiments, at least one of the electrode layer 14' and the insulating film INF' of the light-emitting element LD' may be omitted.

In one embodiment, the light-emitting element LD' may have a polygonal cone shape extending in any one direction. As an example, at least one area of the light-emitting element LD' may have a hexagonal cone shape. However, the shape of the light-emitting element LD' may be variously changed according to some embodiments.

When it is assumed that an extending direction of the light-emitting element LD' is a direction of a length L', the light-emitting element LD' may have a first end portion EP1' and a second end portion EP2' in the direction of the length L'. One of the first and second semiconductor layers 11' and 13' (or electrode layer surrounding one of the first and second semiconductor layers 11' and 13') may be disposed at the first end portion EP1' of the light-emitting element LD', and the other of the first and second semiconductor layers 11' and 13' (or electrode layer surrounding the other one of the first and second semiconductor layers 11' and 13') may be disposed at the second end portion EP2' of the light-emitting element LD'.

In one embodiment, the light-emitting element LD' may have a core-shell structure in which the first end portion EP1' protrudes in a polygonal cone shape (for example, a hexagonal cone shape). For example, the light-emitting element LD' may have a shape in which a hexagonal cone and a hexagonal column are combined. Further, the light-emitting element LD' may be a light-emitting diode having a nano/or micro-size and may have a small size ranging from a nanometer scale to a micrometer scale. As an example, the light-emitting element LD' may have a width W and/or the length L' which are in a range of a nanometer scale or a micrometer scale, but the present disclosure is not necessarily limited thereto. That is, the size, shape, and the like of the light-emitting element LD' may be variously changed according to design conditions of various devices, for example, a display device which uses the light-emitting element LD' as a light source.

In one embodiment, both end portions of the first semiconductor layer 11' may have shapes protruding in the direction of the length L' of the light-emitting element LD'. The protruding shapes of both end portions of the first semiconductor layer 11' may be different. As an example, among both end portions of the first semiconductor layer 11', one end portion disposed at an upper side may have a cone shape (for example, a hexagonal cone shape) which converges to one vertex while a width thereof is gradually decreased toward an upper portion thereof. Further, among both end portions of the first semiconductor layer 11', the other end portion disposed at a lower side may have a polygonal column shape (for example, a hexagonal column shape) having a suitable width (e.g., a set or predetermined width), but the present disclosure is not limited thereto. For example, in another embodiment, the first semiconductor layer 11' may have a cross section having a polygonal shape or a step shape in which a width thereof is gradually decreased toward a lower portion thereof. The shapes of both end portions of the first semiconductor layer 11' may be variously changed according to embodiments.

The first semiconductor layer 11' may be positioned at a core, that is, a center (or central area) of the light-emitting element LD'. Further, the light-emitting element LD' may be provided in a shape corresponding to the shape of the first semiconductor layer 11'. As an example, when the first semiconductor layer 11' has a hexagonal cone shape at one end portion at an upper side, the light-emitting element LD' may have a hexagonal cone shape at one end portion at an upper side (for example, the first end portion EP1').

The active layer 12' may be provided and/or formed to surround an outer peripheral surface of the first semiconductor layer 11'. For example, the active layer 12' is provided in a form that surrounds the remaining area excluding one end portion (for example, one end at a lower side) of the first semiconductor layer 11' in the direction of the length L' of the light-emitting element LD'.

The second semiconductor layer 13' may be provided and/or formed to surround an outer peripheral surface of the active layer 12' and may include a semiconductor layer that is a different type from the first semiconductor layer 11'. As an example, when the first semiconductor layer 11' includes an N-type semiconductor layer, the second semiconductor layer 13' may include a P-type semiconductor layer.

In one embodiment, the light-emitting element LD' may further include an electrode layer 14' surrounding an outer peripheral surface of the second semiconductor layer 13'. The electrode layer 14' may be an ohmic contact electrode or a Schottky contact electrode electrically connected to the second semiconductor layer 13' but is not limited thereto.

A light-emitting device including the light-emitting element LD/LD' described above may be used in various types of devices including a display device, which require a light source. For example, a plurality of light-emitting elements LD/LD' may be disposed in each pixel of a display panel, and the light-emitting element LD/LD' may be used as a light source of each pixel. However, an application field of the light-emitting element LD/LD' is not limited to the above-described example. For example, the light-emitting element LD/LD' may be used in other types of devices, such as a lighting device, which require a light source. For convenience, the light-emitting elements may be designated as LD when describing some embodiments. However, any suitable light-emitting elements LD/LD' may be used. For example, any light-emitting elements LD/LD' of various embodiments illustrated in and/or described in reference to FIGS. 1-6 may be applied to any display device according to embodiments of the present disclosure as light-emitting elements, either individually or in any suitable combination.

In one embodiment, each pixel may include one or more rod-shaped light-emitting elements LD, one or more light-emitting elements LD' having a core-shell structure, or a combination of the rod-shaped light-emitting element LD and the light-emitting element LD' having a core-shell structure. In another embodiment, each pixel may include other light-emitting elements having a different type and/or shape from the rod-shaped light-emitting element LD or the light-emitting element LD' having a core-shell structure.

Figure 7:
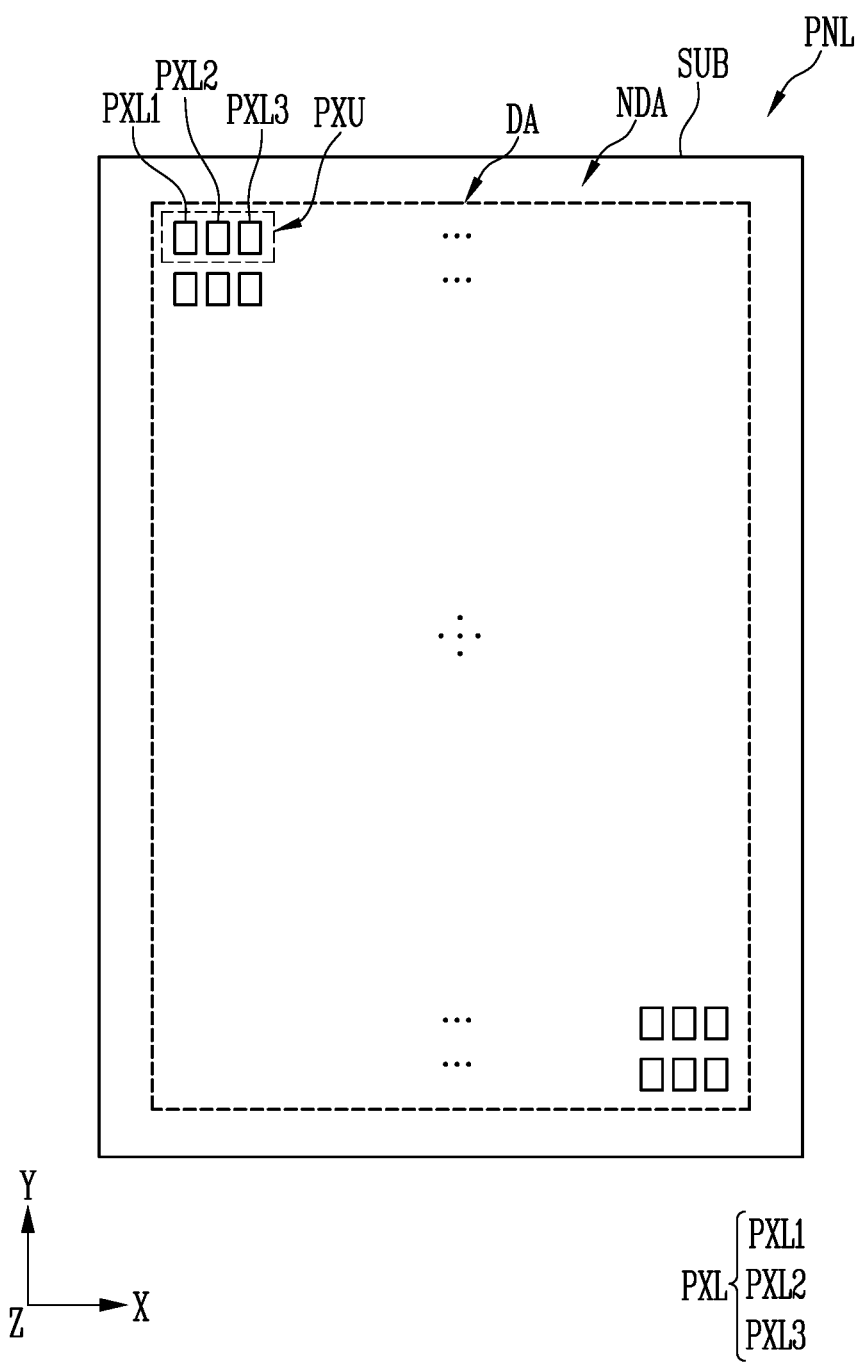
FIG. 7 is a plan view illustrating a display device according to one embodiment.

FIG. 7 is a plan view illustrating a display device according to one embodiment.

As an example of an electronic device which may use the light-emitting elements LD/LD' described in the embodiments of FIGS. 1-6 as a light source, a display device, for example, a display panel PNL included in the display device is illustrated in FIG. 7. For example, each pixel unit PXU of the display panel PNL and each pixel constituting the same may include one or more light-emitting elements LD/LD'.

For convenience, the structure of the display panel PNL is briefly illustrated in FIG. 7 based on a display area DA. However, according to some embodiments, at least one driving circuit unit (for example, at least one of a scan driver and a data driver), lines, and pads may be further disposed in the display panel PNL.

Referring to FIG. 7, the display panel PNL may include a substrate SUB and the pixel unit PXU disposed on the substrate SUB. The pixel units PXU may include first pixels PXL1, second pixels PXL2, and/or third pixels PXL3. Hereinafter, when at least one pixel of the first pixels PXL1, the second pixels PXL2, and the third pixels PXL3 is arbitrarily described, the pixel refers to "pixel PXL," or when at least two pixels thereof are collectively described, the pixels refer to "pixels PXL."

The substrate SUB may constitute a base member of the display panel PNL and may be a rigid or flexible substrate or film. As an example, the substrate SUB may be a rigid substrate made of glass or tempered glass, a flexible substrate (or thin film) made of plastic or metal, or at least one insulating layer. The material and/or physical properties of the substrate SUB are not particularly limited.

In one embodiment, the substrate SUB may be substantially transparent. Here, the term "substantially transparent" may mean that light can be transmitted at a suitable transmittance (e.g., a set or predetermined transmittance) or more. In another embodiment, the substrate SUB may be semi-transparent or opaque. Further, the substrate SUB may include a reflective material according to some embodiments.

The display panel PNL and the substrate SUB for forming the same may include the display area DA for displaying an image and a non-display area NDA excluding the display area DA. For example, the non-display area NDA may surround the display area DA along the edge or periphery of the display area DA.

The pixels PXL may be disposed in the display area DA. Various lines, pads, and/or an embedded circuit unit connected to the pixels PXL of the display area DA may be disposed in the non-display area NDA. The pixels PXL may be regularly arranged according to a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PXL is not limited thereto, and the pixels PXL may be arranged in the display area DA in various structures and/or manners.

According to some embodiments, two or more types of pixels PXL emitting light having different colors may be disposed in the display area DA. As an example, the first pixels PXL1 emitting first color light, the second pixels PXL2 emitting second color light, and the third pixels PXL3 emitting third color light may be arranged in the display area DA. At least one first pixel PXL1, at least one second pixel PXL2, and at least one third pixel PXL3 disposed adjacent to each other may constitute one pixel unit PXU capable of emitting light having various colors. For example, the first pixel PXL1, the second pixel PXL2, and the third pixel PXL3 may be subpixels, each of which emits light having a color (e.g., a set or predetermined color). According to some embodiments, the first pixel PXL1 may be a red pixel which emits red light, the second pixel PXL2 may be a green pixel which emits green light, and the third pixel PXL3 may be a blue pixel which emits blue light, but the present disclosure is not limited thereto.

In one embodiment, the first pixel PXL1, the second pixel PXL2, and the third pixel PXL3 may respectively include a first color light-emitting element, a second color light-emitting element, and a third color light-emitting element as a light source to respectively emit first color light, second color light, and third color light. In another embodiment, the first pixel PXL1, the second pixel PXL2, and the third pixel PXL3 may include light-emitting elements which emit the same color light. Further, the first pixel PXL1, the second pixel PXL2, and the third pixel PXL3 may include color conversion layers and/or color filters having different colors, which are disposed on the light-emitting elements, thereby respectively emitting first color light, second color light, and third color light. However, the color, type, and/or number of the pixels PXL constituting each pixel unit PXU are not particularly limited. As an example, the color of light emitted by each pixel PXL may be variously changed.

The pixel PXL may include at least one light source driven by control signals (e.g., set or predetermined control signals) (for example, a scan signal and a data signal) and/or power sources (e.g., a set or predetermined power sources) (for example, a first power source and a second power source). In one embodiment, the light source may include one or more light-emitting elements LD according to one embodiment of the embodiments of FIGS. 1-4, for example, micro rod-shaped light-emitting elements LD having a small size ranging from a nanometer scale to a micrometer scale, and/or one or more light-emitting elements LD' according to the embodiment of FIGS. 5 and 6, for example, micro core-shell structure light-emitting elements LD' having a small size ranging from a nanometer scale to a micrometer scale. However, the present disclosure is not necessarily limited thereto, and in addition, various types of light-emitting elements LD/LD' may be used as the light source of the pixel PXL.

In one embodiment, each pixel PXL may be formed as an active pixel. However, the type, structure, and/or driving method of the pixels PXL applicable to a display device are not particularly limited. For example, each pixel PXL may be formed as a pixel of a passive or active light-emitting display device having various structures and/or driving methods.

Figure 8:
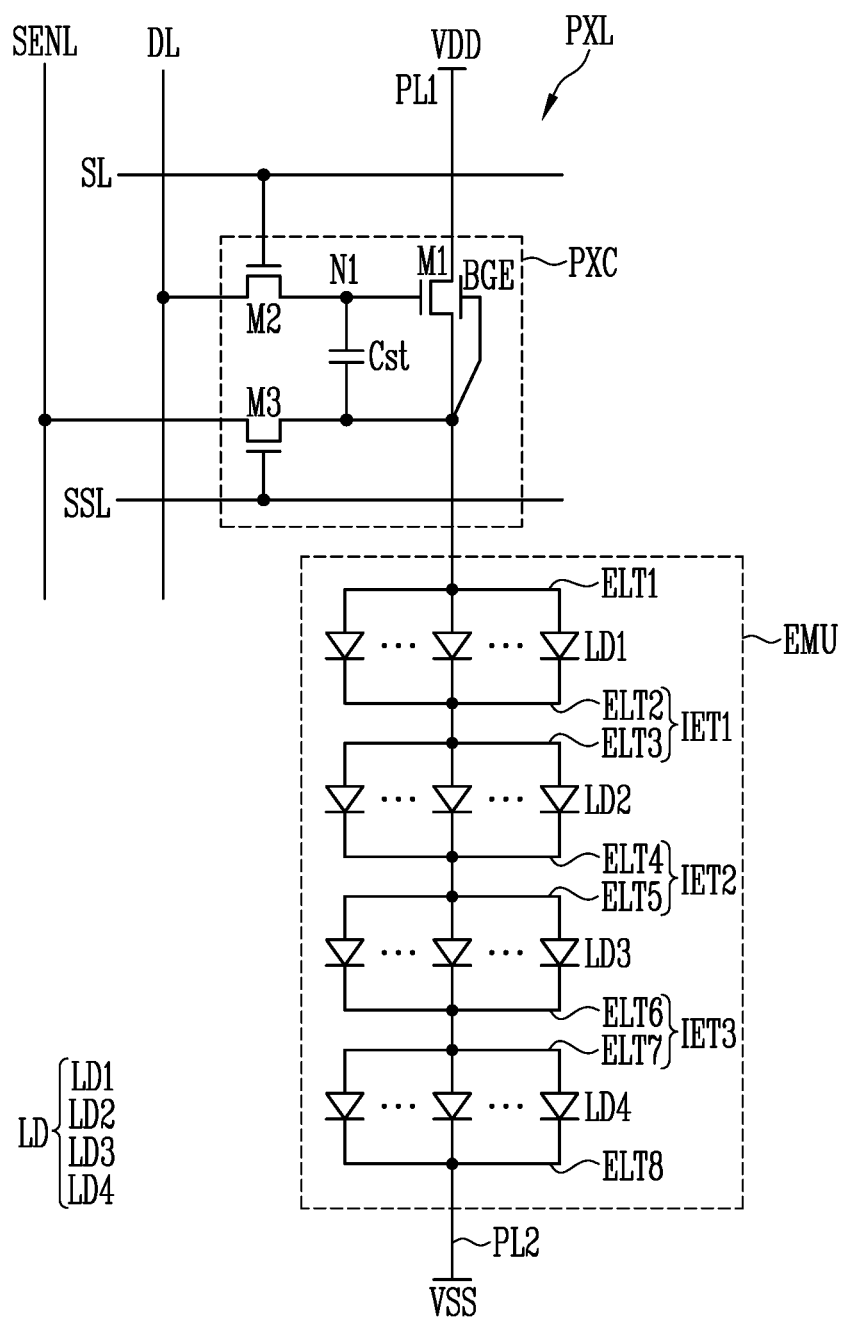
FIG. 8 is a circuit diagram illustrating a pixel according to one embodiment.

FIG. 8 is a circuit diagram illustrating a pixel according to one embodiment. For example, FIG. 8 illustrates an embodiment of a pixel PXL applicable to an active type display device. However, the types of the pixel PXL and the display device are not limited thereto.

According to some embodiments, the pixels PXL illustrated in FIG. 8 may be any one of the first pixel PXL1, the second pixel PXL2, and the third pixel PXL3 provided in the display panel PNL of FIG. 7. The first pixel PXL1, the second pixel PXL2, and the third pixel PXL3 may have substantially the same or similar structure.

Referring to FIG. 8, the pixel PXL may include a light-emitting unit EMU for generating light having luminance corresponding to a data signal and a pixel circuit PXC for driving the light-emitting unit EMU.

The light-emitting unit EMU may include one or more light-emitting elements LD electrically connected between a first power source VDD and a second power source VSS. First end portions (for example, P-type end portions) of the light-emitting elements LD may be electrically connected to the first power source VDD through the pixel circuit PXC, a first power line PL1, and the like, and/or second end portions (for example, N-type end portions) of the light-emitting elements LD may be electrically connected to the second power source VSS through a second power line PL2 and the like.

According to some embodiments, the light-emitting elements LD may be electrically connected to each other through various connection structures between the first power source VDD and the second power source VSS. As an example, the light-emitting elements LD may be connected only in parallel or only in series. Accordingly, the light-emitting elements LD may be connected in a series-parallel combination structure.

For example, as illustrated in FIG. 8, the light-emitting elements LD may be divided into four series stages and connected in series and parallel. In this case, each series stage may include one pair of electrodes (for example, two electrodes) and one or more light-emitting element LD electrically connected between the one pair of electrodes. Here, the numbers of the light-emitting elements LD constituting the series stages may be the same or different, and the number of the light-emitting elements LD is not particularly limited.

For example, a first series stage may include a first electrode ELT1, a second electrode ELT2, and one or more first light-emitting electrodes LD1 electrically connected between the first electrode ELT1 and the second electrode ELT2, and a second series stage may include a third electrode ELT3, a fourth electrode ELT4, and one or more second light-emitting elements LD2 electrically connected between the third electrode ELT3 and the fourth electrode ELT4. Similarly, a third series stage may include a fifth electrode ELT5, a sixth electrode ELT6, and one or more third light-emitting elements LD3 electrically connected between the fifth electrode ELT5 and the sixth electrode ELT6, and a fourth series stage may include a seventh electrode ELT7, an eighth electrode ELT8, and one or more fourth light-emitting elements LD4 electrically connected between the seventh electrode ELT7 and the eighth electrode ELT8.

A first electrode of the light-emitting unit EMU, for example, the first electrode ELT1, may be a first pixel electrode (or anode) of the light-emitting unit EMU. A last electrode of the light-emitting unit EMU, for example, the eighth electrode ELT8, may be a second pixel electrode (or cathode) of the light-emitting unit EMU.

The remaining electrodes of the light-emitting unit EMU, for example, the second to seventh electrodes ELT2 to ELT7, may each constitute an intermediate electrode. For example, the second electrode ELT2 and the third electrode ELT3 may be integrally or non-integrally connected to each other to form a first intermediate electrode IET1. Similarly, the fourth electrode ELT4 and the fifth electrode ELT5 may be integrally or non-integrally connected to each other to form a second intermediate electrode IET2, and the sixth electrode ELT6 and the seventh electrode ELT7 may be integrally or non-integrally connected to each other to form a third intermediate electrode IET3. In this case, the second and third electrodes ELT2 and ELT3 may be integrated to be regarded as one first intermediate electrode IET1, the fourth and fifth electrodes ELT4 and ELT5 may be integrated to be regarded as one second intermediate electrode IET2, and the sixth and seventh electrodes ELT6 and ELT7 may be integrated to be regarded as one third intermediate electrode IET3.

While FIG. 8 illustrates an embodiment in which the light-emitting elements LD are connected in a four-stage series-parallel combination structure, the present disclosure is not limited thereto. For example, in another embodiment, at least two light-emitting elements LD may be connected in a two-stage series or series-parallel combination structure, or four or more light-emitting elements LDs may be connected in a series or series-parallel combination structure with four or more stages.

Assuming that the light-emitting unit EMU is formed using the light-emitting elements LD under the same conditions (for example, the same size and/or number) as an effective light source, when the light-emitting elements LD are connected in a series or series-parallel combination structure, power efficiency may be improved. For example, in the light-emitting unit EMU in which the light-emitting elements LD are connected in series or in series-parallel, higher luminance may be expressed (or realized) with the same current as compared with a light-emitting unit in which the light-emitting elements LD are connected only in parallel. Further, in the light-emitting unit EMU in which the light-emitting elements LD are connected in series or in series-parallel, the same luminance may be expressed with a lower driving current as compared with a light-emitting unit in which the light-emitting elements LD are connected in parallel. Furthermore, in the pixel PXL in which the light-emitting elements LD are connected in a series or series-parallel combination structure, even when short circuit defects occur in some series stages, a certain degree of luminance may be expressed through the light-emitting elements LD of the remaining series stage, thereby reducing the possibility of dark spot defects of the pixel PXL.

Each of the light-emitting elements LD may include the first end portion (for example, the P-type end portion) electrically connected to the first power source VDD through the first pixel electrode (for example, the first electrode ELT1), the pixel circuit PXC, the first power line PL1, and/or the like, and the second end portion (for example, the N-type end portion) electrically connected to the second power source VSS through the second pixel electrode (for example, the eighth electrode ELT8), the second power line PL2, and the like. That is, the light-emitting elements LD may be connected in a forward direction between the first power source VDD and the second power source VSS. As described above, each of the light-emitting elements LD connected in the forward direction between the first power source VDD and the second power source VSS may constitute each effective light source. The effective light sources may be clustered to constitute the light-emitting unit EMU of the pixel PXL.

The first power source VDD and the second power source VSS may have different potentials such that the light-emitting elements LD emit light. As an example, the first power source VDD may be set as a high potential power source, and the second power source VSS may be set as a low potential power source. In this case, the first power source VDD and the second power source VSS may have a potential difference such that the light-emitting elements LD emit light during an emission period of the pixel PXL.

When a driving current is supplied through the corresponding pixel circuit PXC, the light-emitting elements LD may emit light with luminance corresponding to the driving current. For example, during each frame period, the pixel circuit PXC may supply a driving current corresponding to a gradation value expressed in a corresponding frame to the light-emitting unit EMU. Accordingly, while the light-emitting element LD emit light with luminance corresponding to a driving current, the light-emitting unit EMU may emit light with luminance corresponding to the driving current.

In one embodiment, the light-emitting unit EMU may further include at least one ineffective light source in addition to the light-emitting elements LD each constituting the effective light source. As an example, at least one ineffective light-emitting element, which is arranged in a reverse direction or of which at least one end portion is enabled, may be further connected to at least one series stage. Even when a driving voltage (e.g., a set or predetermined driving voltage) (for example, a forward driving voltage) is applied between the first pixel electrode and the second pixel electrode, the ineffective light-emitting element may maintain an inactive state and thus may maintain substantially a non-emission state.

The pixel circuit PXC may be electrically connected between the first power source VDD and the light-emitting unit EMU. The pixel circuit PXC may be connected to a scan line SL and a data line DL of the corresponding pixel PXL. In addition, the pixel circuit PXC may be further selectively connected to a sensing signal line SSL and a sensing line SENL.

The pixel circuit PXC may include a first transistor M1, a second transistor M2, a third transistor M3, and a storage capacitor Cst.

The first transistor M1 is electrically connected between the first power source VDD and the first electrode ELT1 of the light-emitting unit EMU. A gate electrode of the first transistor M1 is electrically connected to a first node N1. The first transistor M1 controls a driving current supplied to the light-emitting unit EMU in response to a voltage of the first node N1. That is, the first transistor M1 may be a driving transistor which controls a driving current of the pixel PXL. In addition, the first transistor M1 may further selectively include a back gate electrode BGE electrically connected to the first electrode ELT1. The back gate electrode BGE may be disposed to overlap the gate electrode with an insulating layer interposed therebetween.

The second transistor M2 is electrically connected between the data line DL and the first node N1. A gate electrode of the second transistor M2 is electrically connected to the scan line SL. When a scan signal having a gate-on voltage (for example, a high level voltage) is supplied from the scan line SL, the second transistor M2 is turned on to electrically connect the data line DL and the first node N1. During each frame period, a data signal of a corresponding frame is supplied to the data line DL, and the data signal is transmitted to the first node N1 through the second transistor M2 turned on during a period in which the scan signal having a gate-on voltage (e.g., a high level voltage) is supplied. That is, the second transistor M2 may be a switching transistor for transmitting each data signal into the pixel PXL.

One electrode of the storage capacitor Cst is electrically connected to the first node N1, and the other electrode thereof is electrically connected to the first electrode ELT1 of the light-emitting unit EMU (or a second electrode of the first transistor M1). The storage capacitor Cst is charged with a voltage (or holds a charge) corresponding to a data signal supplied to the first node N1 during each frame period.

The third transistor M3 is electrically connected between the first electrode ELT1 of the light-emitting unit EMU and the sensing line SENL. A gate electrode of the third transistor M3 is electrically connected to the sensing signal line SSL. The third transistor M3 may transmit a voltage value applied to the first electrode ELT1 of the light-emitting unit EMU (or voltage value applied to the anode of the light-emitting element LD) to the sensing line SENL according to a sensing signal supplied to the sensing signal line SSL during a sensing period (e.g., a set or predetermined sensing period). The voltage value transmitted through the sensing line SENL may be provided to an external circuit (for example, a timing controller), and the external circuit may extract characteristic information of each pixel PXL (for example, a threshold voltage and the like of the first transistor M1) based on the supplied voltage value. The extracted characteristic information may be used to convert image data so that a characteristic deviation between the pixels PXL is compensated for.

While in FIG. 8, the transistors included in the pixel circuit PXC, for example, all of the first, second, and third transistors M1, M2, and M3 are illustrated as being N-type transistors, the present disclosure is not necessarily limited thereto. For example, at least one of the first to third transistors T1 to T3 may be changed to a P-type transistor. Alternatively, the pixel circuit PXC may include P-type and N-type transistors in combination. For example, some of the transistors included in the pixel circuit PXC may be P-type transistors, and the others may be N-type transistors. In this case, a voltage level of control signals (for example, a scan signal, a data signal, and/or a sensing signal) for driving each transistor may be adjusted according to the type of transistors, as one of ordinary skill in the art would appreciate.

Further, the structure and driving method of the pixel PXL may be variously changed according to embodiments. For example, the pixel circuit PXC may be provided as a pixel circuit having various structures and/or driving methods in addition to the embodiment illustrated in FIG. 8. As an example, the third transistor M3 may be omitted, or the pixel circuit PXC may further include additional circuit elements such as a transistor for compensating for a threshold voltage of the first transistor M1, a transistor for initializing a voltage of the first node N1 or the first electrode ELT1 of the light-emitting unit EMU, a transistor for controlling a period in which a driving current is supplied to the light-emitting unit EMU, and/or a boosting capacitor for boosting the voltage of the first node N1. In another embodiment, when each pixel PXL is provided in a passive light-emitting display device or the like, the pixel circuit PXC may be omitted. In this case, each of the first and second pixel electrodes of the light-emitting unit EMU may be connected directly to the scan line SL, the data line DL, the first power line PL1, the second power line PL2, or other signal lines or power lines.

Figure 9:
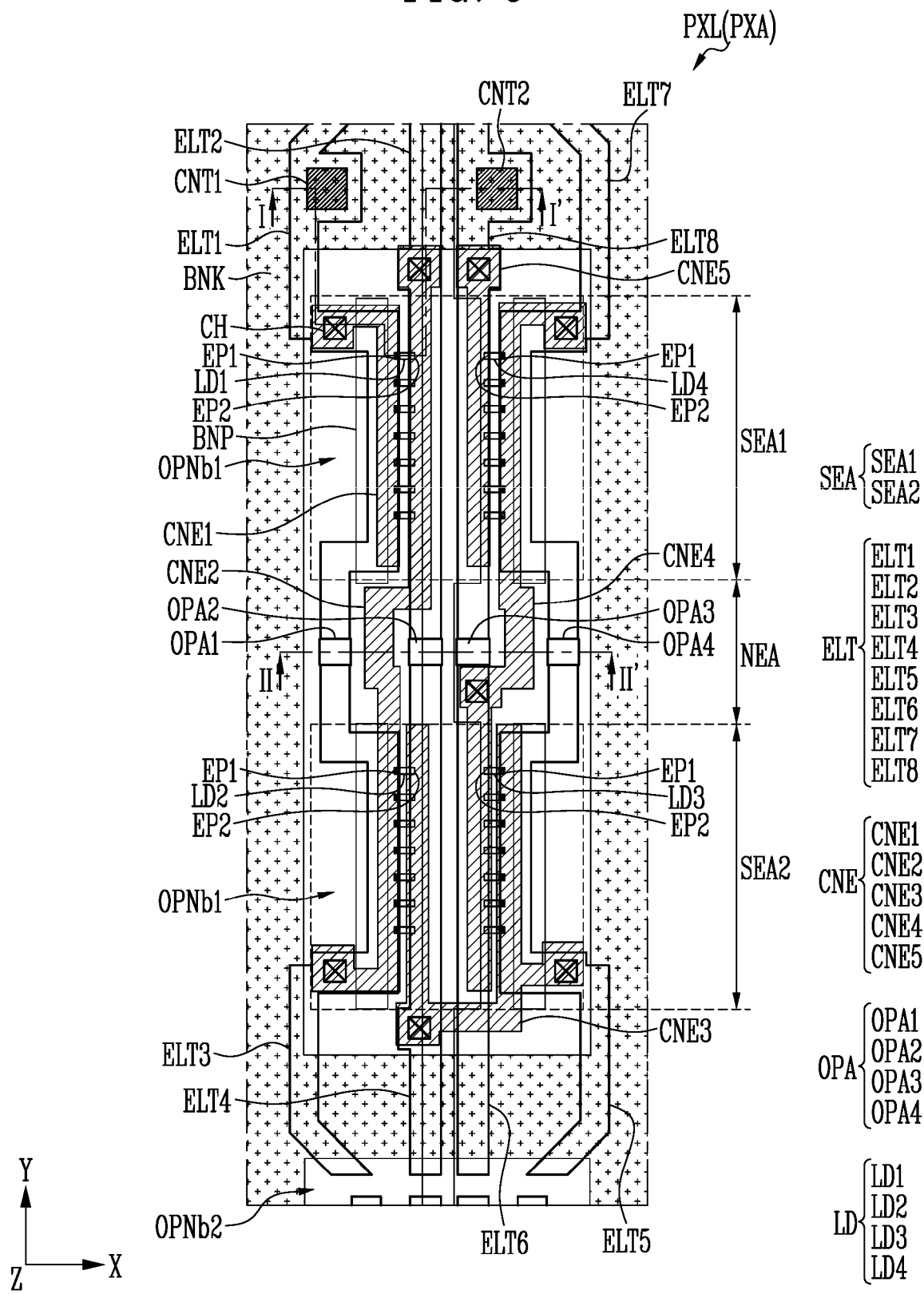
FIG. 9 is a plan view illustrating a pixel according to one embodiment.

FIG. 9 is a plan view illustrating a pixel according to one embodiment.

As an example, the pixel of FIG. 9 may be any one of the first to third pixels PXL1, PXL2, and PXL3 constituting the pixel unit PXU of FIG. 7, and the first to third pixels PXL1, PXL2, and PXL3 may have substantially the same or similar structure. While FIG. 9 illustrates an embodiment in which each pixel PXL includes light-emitting elements LD disposed at four series stages as illustrated in FIG. 8, the number of the series stages of each pixel PXL may be variously changed according to embodiments.

Hereinafter, when at least one light-emitting element of first to fourth light-emitting elements LD1 to LD4 is arbitrarily described, the light-emitting element refers to "light-emitting element LD," or when at least two light-emitting elements thereof are collectively described, the light-emitting elements refer to "light-emitting elements LD." Further, when at least one pixel electrode of pixel electrodes including first to eighth electrodes ELT1 to ELT8 is arbitrarily described, the pixel electrode refers to "pixel electrode ELT" or "pixel electrodes ELT," and when at least one contact electrode of contact electrodes including first to fifth contact electrodes CNE1 to CNE5 is arbitrarily described, the contact electrode refers to "contact electrode CNE" or "contact electrodes CNE."

Referring to FIG. 9, each pixel PXL may include a first area SEA and a second area NEA. The first area SEA may be an emission area and may include a first emission area SEA1 and a second emission area SEA2 that are spaced from each other. The first emission area SEA1 and the second emission area SEA2 may be disposed in a pixel area PXA to be spaced from each other in a second direction (Y-axis direction). The second area NEA may be a non-emission area and may be disposed between the first emission area SEA1 and the second emission area SEA2.

The first area SEA may include one or more light-emitting elements LD and electrodes electrically connected thereto. In one embodiment, when the pixel PXL includes the plurality of light-emitting elements LD that are divided and disposed at a plurality of series stages as in the embodiment illustrated in FIG. 8, each of the first and second emission areas SEA1 and SEA2 may include the light-emitting elements LD disposed in at least one series stage and electrodes electrically connected thereto. For example, the first emission area SEA1 may include first light-emitting elements LD1 disposed at a first series stage of the corresponding pixel PXL and a plurality of electrodes connected thereto, and the second emission area SEA2 may include second light-emitting elements LD2 disposed at a second series stage and a plurality of electrodes connected thereto. In this case, the first light-emitting element LD1 disposed in the first emission area SEA1 and the second light-emitting element LD2 disposed in the second emission area SEA2 may be connected in series. As an example, the first light-emitting element LD1 and the second light-emitting element LD2 may be connected in series using at least one contact electrode CNE.

Further, when it is assumed that each pixel PXL includes a larger number of series stages than the number of the emission areas SEA1 and SEA2 of the first area SEA, each of the emission areas SEA1 and SEA2 may include the light-emitting elements LD disposed at two or more series stages and the electrodes connected thereto. For example, the first emission area SEA1 may include light-emitting elements LD1 and LD4 disposed at first and fourth series stages of a light-emitting unit EMU and electrodes, and the second emission area SEA2 may include light-emitting elements LD2 and LD3 disposed at second and third series stages and electrodes.

For example, the pixel PXL may include a first electrode ELT1, a second electrode ELT2, and one or more first light-emitting elements LD1 electrically connected between the first electrode ELT1 and the second electrode ELT2 disposed in the first emission area SEA1, and a third electrode ELT3, a fourth electrode ELT4, and one or more second light-emitting elements LD2 electrically connected between the third electrode ELT3 and the fourth electrode ELT4 disposed in the second emission area SEA2. The pixel PXL may further include a fifth electrode ELT5, a sixth electrode ELT6, and one or more third light-emitting elements LD3 electrically connected between the fifth electrode ELT5 and the sixth electrode ELT6 disposed in the second emission area SEA2, and a seventh electrode ELT7, an eighth electrode ELT8, and one or more fourth light-emitting elements LD4 electrically connected between the seventh electrode ELT7 and the eighth electrode ELT8 disposed in the first emission area SEA1.

While FIG. 9 illustrates a case where the fifth electrode ELT5, the sixth electrode ELT6, and the third light-emitting element LD3 are disposed in the second emission area SEA2, and the seventh electrode ELT7, the eighth electrode ELT8, and the fourth light-emitting element LD4 are disposed in the first emission area SEA1, the present disclosure is not necessarily limited thereto. That is, in another embodiment, the fifth electrode ELT5, the sixth electrode ELT6, and the third light-emitting element LD3 may be disposed in the first emission area SEA1, and the seventh electrode ELT7, the eighth electrode ELT8, and the fourth light-emitting element LD4 may be disposed in the second emission area SEA2.

In each of the emission areas SEA1 and SEA2, the first to eighth electrodes ELT1 to ELT8 may each extend in a second direction (Y-axis direction). For example, the first electrode ELT1, the second electrode ELT2, the seventh electrode ELT7, and/or the eighth electrode ELT8 may each extend in the second direction (Y-axis) in the first emission area SEA1 and may be sequentially disposed along a first direction (X-axis direction) to be spaced from each other.

Further, the third electrode ELT3, the fourth electrode ELT4, the fifth electrode ELT5, and/or the sixth electrode ELT6 may each extend in the second direction (Y-axis) in the second emission area SEA2 and may be sequentially disposed along the first direction (X-axis direction) to be spaced from each other. Further, the first to eighth electrodes ELT1 to ELT8 may have a uniform width or a non-uniform width and may or may not include a curved portion. That is, the shape and/or the mutual arrangement structure of each of the first to eighth electrodes ELT1 to ELT8 may be variously changed according to embodiments.

The first to eighth electrodes ELT1 to ELT8 may constitute pixel electrodes ELT of each pixel PXL. Some of the first to eighth electrodes ELT1 to ELT8 may be first formed of one alignment line and then may be disconnected between adjacent pixels PXL and in a second area NEA between the first emission area SEA1 and the second emission area SEA2 of each pixel PXL, thereby being separated into the pixel electrodes ELT of each series stage. When each alignment line is separated in the second area NEA, one ends of the first to eighth electrodes ELT1 to ELT8 may partially extend to the second area NEA, but the present disclosure is not necessarily limited thereto. The second area NEA may be a non-emission area and may provide a space for separating each alignment line into the plurality of pixel electrodes ELT after the light-emitting elements LD are aligned and/or connecting the pixel electrodes ELT through at least one contact electrode CNE.

For example, the second area NEA may include opening areas OPA for separating the alignment lines into the plurality of pixel electrodes ELT. The opening areas OPA may include first to fourth opening areas OPA1 to OPA4 spaced from each other. The first to fourth opening areas OPA1 to OPA4 may be disposed along the first direction (X-axis direction) in the second area NEA.

The first opening area OPA1 may be disposed between the first electrode ELT1 and the third electrode ELT3. That is, the first electrode ELT1 and the third electrode ELT3 may be spaced from each other along the second direction (Y-axis direction) with the first opening area OPA1 interposed therebetween. A width of the first opening area OPA1 in the first direction (X-axis direction) may be greater than a width of each of the first electrode ELT1 and/or the third electrode ELT3 in the first direction (X-axis direction), but the present disclosure is not necessarily limited thereto.

The second opening area OPA2 may be disposed between the second electrode ELT2 and the fourth electrode ELT4. That is, the second electrode ELT2 and the fourth electrode ELT4 may be spaced from each other along the second direction (Y-axis direction) with the second opening area OPA2 interposed therebetween. A width of the second opening area OPA2 in the first direction (X-axis direction) may be greater than a width of each of the second electrode ELT2 and/or the fourth electrode ELT4 in the first direction (X-axis direction), but the present disclosure is not necessarily limited thereto.

The third opening area OPA3 may be disposed between the sixth electrode ELT6 and the eighth electrode ELT8. That is, the sixth electrode ELT6 and the eighth electrode ELT8 may be spaced from each other along the second direction (Y-axis direction) with the third opening area OPA3 interposed therebetween. A width of the third opening area OPA3 in the first direction (X-axis direction) may be greater than a width of each of the sixth electrode ELT6 and/or the eighth electrode ELT8 in the first direction (X-axis direction), but the present disclosure is not necessarily limited thereto.

The fourth opening area OPA4 may be disposed between the fifth electrode ELT5 and the seventh electrode ELT7. The fifth electrode ELT5 and the seventh electrode ELT7 may be spaced from each other along the second direction (Y-axis direction) with the fourth opening area OPA4 interposed therebetween. A width of the fourth opening area OPA4 in the first direction (X-axis direction) may be greater than a width of each of the fifth electrode ELT5 and/or the seventh electrode ELT7 in the first direction (X-axis direction), but the present disclosure is not necessarily limited thereto.

One of the above-described pixel electrodes ELT, for example, the first electrode ELT1, may be electrically connected to a pixel circuit PXC and/or a first power line PL1 through a first contact portion CNT1. Another one of the pixel electrodes ELT, for example, the eighth electrode ELT8, may be electrically connected to a second power line PL2 through a second contact portion CNT2.

In one embodiment, a bank pattern BNP may be disposed under one area of each of the first to eighth electrodes ELT1 to ELT8. In this case, one area of each of the first to eighth electrodes ELT1 to ELT8 may protrude upward (for example, a third direction (Z-axis direction) due to the bank pattern BNP so that a partition wall may be formed around the light-emitting elements LD. Accordingly, the luminous efficiency of the pixel PXL can be improved. Each bank pattern BNP may be formed to overlap one pixel electrode ELT or may be formed to overlap the plurality of pixel electrodes ELT.

According to some embodiments, the first to eighth electrodes ELT1 to ELT8 may be in direct contact with and connected to the light-emitting elements LD of the corresponding one of the series stages or may be electrically connected to the light-emitting elements LD through the separate contact electrode CNE or the like. For example, the first to eighth electrodes ELT1 to ELT8 may be insulated from first end portions EP1 or second end portions EP2 of the light-emitting elements LD by a first insulating layer INS1 and may be electrically connected to the first or second end portions EP1 and EP2 of adjacent light-emitting elements LD through each contact electrode CNE.

Further, any one electrode (for example, one of the first, second, seventh, and eighth electrodes ELT1, ELT2, ELT7, and ELT8) disposed in the first emission area SEA1 may be electrically connected to any one electrode (for example, one of the third to sixth electrodes ELT3 to ELT6) disposed in the second area SEA2 through at least one contact electrode CNE. To this end, each pixel PXL may include first to fifth contact electrodes CNE1 to CNE5 for electrically connecting certain electrodes positioned in the first and second emission areas SEA1 and SEA2 to each other.

The first contact electrode CNE1 may be disposed on the first light-emitting elements LD1 (for example, the first end portions EP1) of the first series stage and the first electrode ELT1 to electrically connect the first end portions EP1 of the first light-emitting elements LD1 of the first series stage to the first electrode ELT1.

The second contact electrode CNE2 may be disposed on the first light-emitting elements LD1 (for example, the second end portions EP2) of the first series stage and the second electrode ELT2 to electrically connect the second end portions EP2 of the first light-emitting elements LD1 to the second electrode ELT2. Further, the second contact electrode CNE2 may be disposed on the second light-emitting elements LD2 (for example, the first end portions EP1) of the second series stage and the third electrode ELT3 to electrically connect the first end portions EP1 of the second light-emitting elements LD2 to the third electrode ELT3. To this end, the second contact electrode CNE2 may extend from the first emission area SEA1 to the second emission area SEA2 through the second area NEA. However, in another embodiment, the second contact electrode CNE2 may be provided as a plurality of separate electrodes, and the separate electrodes may be electrically connected to each other through a bridge pattern or the like.

The third contact electrode CNE3 may be disposed on the second light-emitting elements LD2 (for example, the second end portions EP2) of the second series stage and the fourth electrode ELT4 to electrically connect the second end portions EP2 of the second light-emitting elements LD2 to the fourth electrode ELT4. Further, the third contact electrode CNE3 may be disposed on the third light-emitting elements LD3 (for example, the first end portions EP1) of the third series stage and the fifth electrode ELT5 to electrically connect the first end portions EP1 of the third light-emitting elements LD3 to the fifth electrode ELT5. However, in another embodiment, the third contact electrode CNE3 may be provided as a plurality of separate electrodes, and the separate electrodes may be electrically connected to each other through a bridge pattern or the like.

The fourth contact electrode CNE4 may be disposed on the third light-emitting elements LD3 (for example, the second end portions EP2) of the third series stage and the sixth electrode ELT6 to electrically connect the second end portions EP2 of the third light-emitting elements LD3 to the sixth electrode ELT6. Further, the fourth contact electrode CNE4 may be disposed on the fourth light-emitting elements LD4 (for example, the first end portions EP1) of the fourth series stage and the seventh electrode ELT7 to electrically connect the first end portions EP1 of the fourth light-emitting elements LD4 to the seventh electrode ELT7. To this end, the fourth contact electrode CNE4 may extend from the second emission area SEA2 to the first emission area SEA1 through the second area NEA. However, in another embodiment, the fourth contact electrode CNE4 may be provided as a plurality of separate electrodes, and the separate electrodes may be electrically connected to each other through a bridge pattern or the like.

The fifth contact electrode CNE5 may be disposed on the fourth light-emitting elements LD4 (for example, the second end portions EP2) of the fourth series stage and the eighth electrode ELT8 to connect the second end portions EP2 of the fourth light-emitting elements LD4 to the eighth electrode ELT8.

In one embodiment, at least one insulating layer may be interposed between each contact electrode CNE and the corresponding pixel electrode ELT, and each contact electrode CNE and the pixel electrode ELT corresponding thereto may be electrically connected to each other through a contact hole CH formed in the insulating layer. However, the connection structure between the contact electrode CNE and the pixel electrode ELT may vary according to embodiments.

According to the above-described embodiment, the pixel electrodes ELT can be connected in a desired shape using the contact electrodes CNE. As an example, the first light-emitting elements LD1 disposed at one side of the first emission area SEA1, the second light-emitting elements LD2 disposed at one side of the second emission area SEA2, the third light-emitting elements LD3 disposed at the other side of the second emission area SEA2, and the fourth light-emitting elements LD4 disposed at the other side of the first emission area SEA1 may be sequentially connected in series.

Each of the pixels PXL may further include a bank BNK disposed at an edge of the pixel area PXA. The bank BNK is a structure defining an emission area of each pixel PXL and may be disposed at a boundary between adjacent pixel areas PXA. The bank BNK may be, for example, a pixel definition film. The bank BNK may include at least one light blocking and/or reflective material to prevent light leakage between adjacent pixel areas PXA. For example, the bank BNK may include at least one black matrix material (for example, at least one light blocking material currently known) selected from various types of black matrix materials, and/or a color filter material of a specific color. As an example, the bank BNK may be formed in a black opaque pattern capable of blocking transmission of light.

The bank BNK may be disposed to surround in the first area SEA and the second area NEA. The bank BNK may include a first bank opening OPNb1 comprehensively exposing the first area SEA and the second area NEA. That is, the first area SEA and the second area NEA are directly adjacent, and the bank BNK may be disposed to surround an entire edge including the first area SEA and the second area NEA. In one embodiment, the bank BNK may further include second bank openings OPNb2 corresponding to an upper end area and/or a lower end area of each pixel area PXA in addition to the first bank opening OPNb1 exposing the first area SEA and the second area NEA of each pixel PXL.

In some embodiments, the bank BNK is disposed to surround the entirety of the first area SEA and the second area NEA and is omitted in the second area NEA that is a non-emission area within the pixel area PXA, thereby increasing or maximizing an area of the emission area of the pixel PXL. However, in this case, the light-emitting elements LD may be supplied to the second area NEA other than the first area SEA to which the light-emitting elements LD are to be supplied, and the light-emitting elements LD present in the second area NEA may be separated in a subsequent process and cause short circuit defects and/or a foreign material defects. Accordingly, in the display device according to one embodiment, an opening OP1 is formed in the first insulating layer INS1 (see FIG. 12) of the second area NEA, and the light-emitting elements LD are fixed using a second insulating layer INS2, thereby preventing the separation of the light-emitting elements LD present in the second area NEA. This will be described in detail below with reference to FIG. 12.

Figure 10:
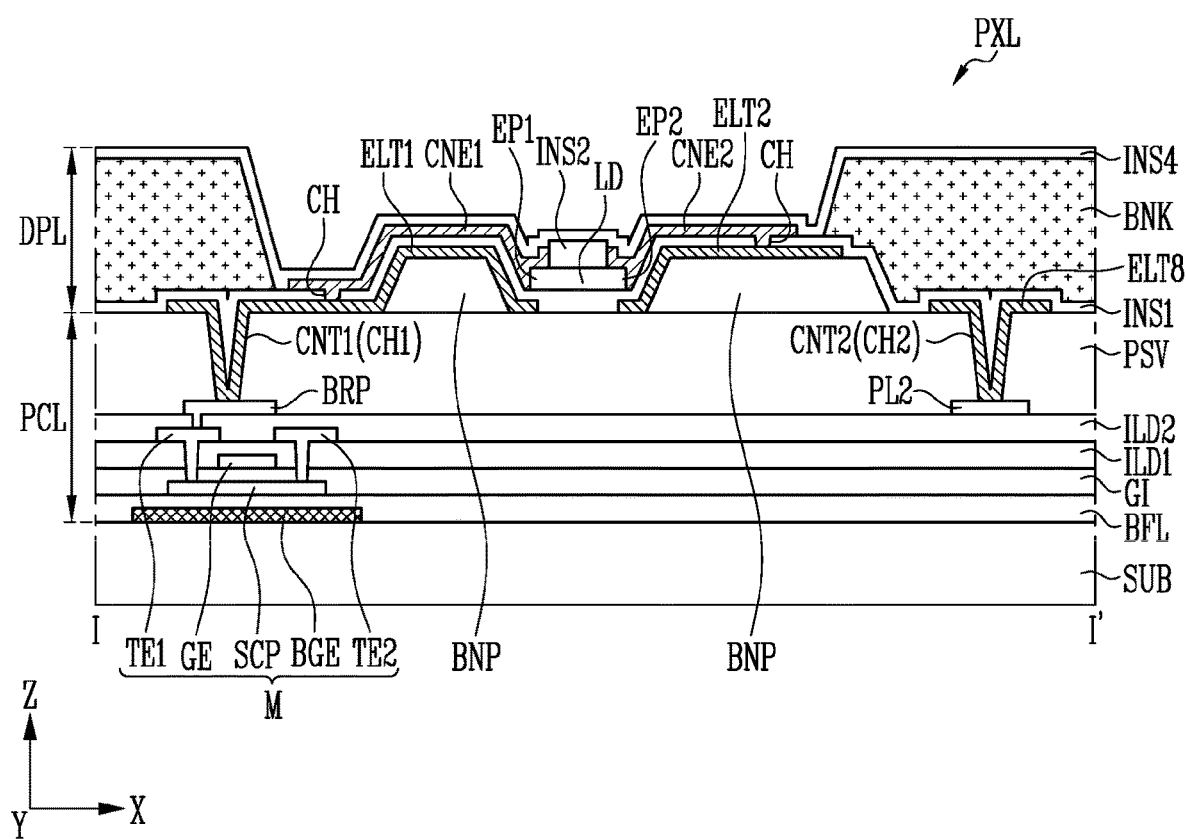
FIGS. 10 and 11 are cross-sectional views taken along the line I-I' of FIG. 9.
Figure 11:
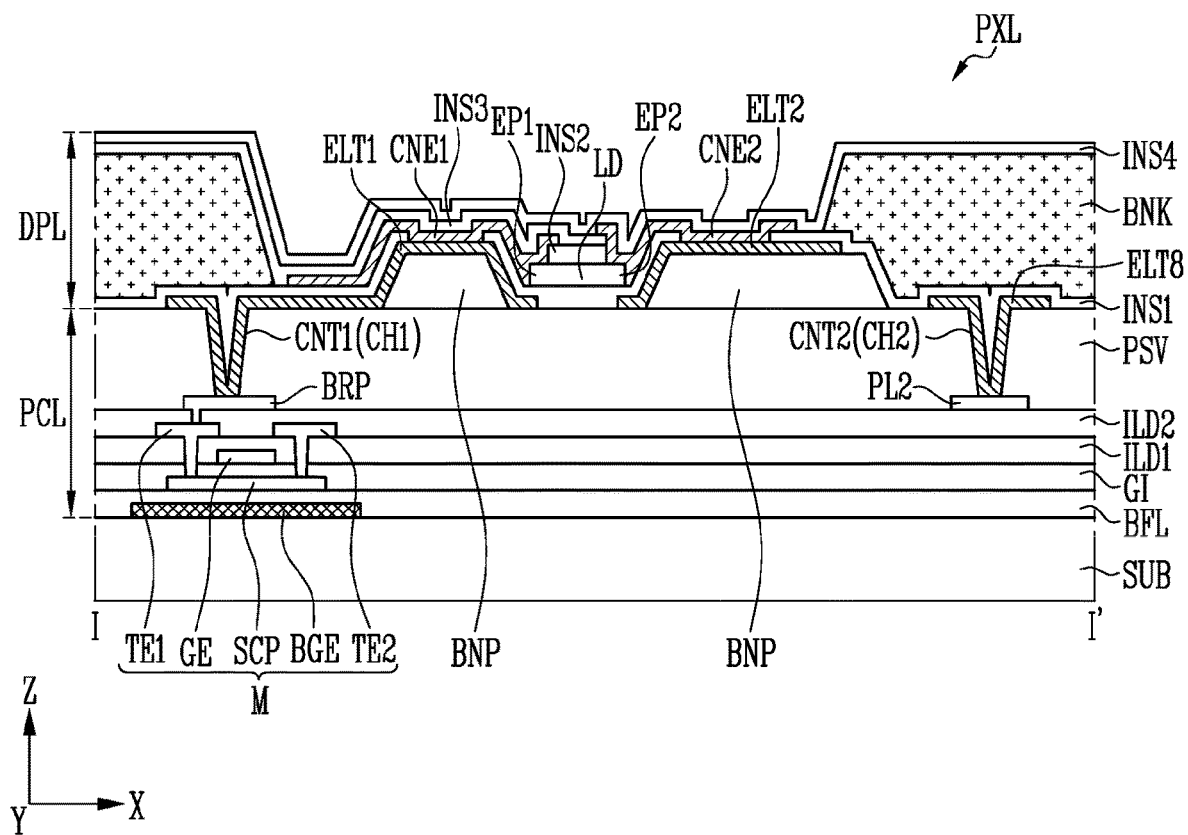

FIGS. 10 and 11 are cross-sectional views taken along the line I-I' of FIG. 9.

As an example of circuit elements that may be disposed on a pixel circuit layer PCL, FIGS. 10 and 11 illustrate arbitrary transistors M (for example, transistors electrically connected to a first electrode ELT1 through a first contact portion CNT1 and a bridge pattern BRP) and a second power line PL2 electrically connected to an eighth electrode ELT8 through a second contact portion CNT2.

Referring to FIGS. 10 and 11, a pixel PXL and a display device including the same according to one embodiment may include the circuit layer PCL and a display layer DPL disposed on one surface of a substrate SUB.

Circuit elements constituting a pixel circuit PXC (for example, the transistors M and a storage capacitor Cst (see FIG. 8) and various lines electrically connected thereto may be disposed on the circuit layer PCL. Pixel electrodes ELT, light-emitting elements LD, and/or contact electrodes CNE constituting a light-emitting unit EMU of the corresponding pixel PXL may be disposed in each pixel area PXA of the display layer DPL.

For example, the circuit layer PCL may further include a first conductive layer including at least one lower electrode layer or the like disposed under at least some of the transistors M (or a back gate electrode BGE of the transistor M). The lower electrode layer may serve as a light blocking layer, but the present disclosure is not necessarily limited thereto.

A buffer layer BFL may be disposed on one surface of the substrate SUB including the first conductive layer. The buffer layer BFL may prevent or reduce impurities from diffusing into each circuit element.

A semiconductor layer may be disposed on the buffer layer BFL. The semiconductor layer may include a semiconductor pattern SCP or the like of each transistor M. The semiconductor pattern SCP may include a channel region overlapping a gate electrode GE and first and second conductive regions (for example, source and drain regions) disposed at both sides of the channel region.

A gate insulating layer GI may be disposed on the semiconductor layer. A second conductive layer may be disposed on the gate insulating layer GI. The second conductive layer may include the gate electrode GE of each transistor M. The second conductive layer may further include one electrode of the storage capacitor Cst and/or certain lines.

A first interlayer insulating layer ILD1 may be disposed on the second conductive layer. A third conductive layer may be disposed on the first interlayer insulating layer ILD1. The third conductive layer may include first and second transistor electrodes TE1 and TE2 of each transistor M. Here, the first and second transistor electrodes TE1 and TE2 may be source and drain electrodes, respectively. The third conductive layer may further include one electrode of the storage capacitor Cst and/or certain lines.

A second interlayer insulating layer ILD2 may be disposed on the third conductive layer. A fourth conductive layer may be disposed on the second interlayer insulating layer ILD2. The fourth conductive layer may include a bridge pattern BRP for electrically connecting the circuit layer PCL and the display layer DPL and/or certain lines (for example, a first power line PL1 and/or the second power line PL2). The bridge pattern BRP may be electrically connected to a first pixel electrode (for example, the first electrode ELT1) of the light-emitting unit EMU through a contact hole CH1 formed in the first contact portion CNT1. The second power line PL2 may be electrically connected to a last pixel electrode (for example, an eighth electrode ELT8) of the light-emitting unit EMU through a second contact hole CH2 formed in the second contact portion CNT2.

A passivation layer PSV may be disposed on the fourth conductive layer. According to some embodiments, the passivation layer PSV may include at least an organic insulating layer and may substantially planarize a surface of the circuit layer PCL. The display layer DPL may be disposed on the passivation layer PSV.

The display layer DPL may include the plurality of pixel electrodes ELT (for example, first to eighth electrodes ELT1 to ELT8) disposed in emission areas SEA1 and SEA2, the plurality of light-emitting elements LD connected in series, parallel, or series-parallel between the pixel electrodes ELT, and the plurality of contact electrodes CNE connecting the pixel electrodes ELT and the light-emitting elements LD.

While in FIGS. 10 and 11, one light-emitting element LD is illustrated, as in the embodiment of FIG. 9, the pixel PXL may include a plurality of light-emitting elements LD connected in a forward direction between the first pixel electrode and the last pixel electrode (for example, the first electrode ELT1 and the eighth electrode ELT8). Accordingly, each embodiment will be described below assuming that the pixel PXL includes the plurality of light-emitting elements LD.

Further, the display layer DPL may include a separate or integral bank pattern BNP for making one area of each of the pixel electrodes ELT protrude upward, and/or a bank BNK for surrounding the pixel area PXA. The display layer DPL may further include at least one conductive layer and/or at least one insulating layer. For example, the display layer DPL may include the pixel electrodes ELT, a first insulating layer INS1, the light-emitting elements LD, a second insulating layer INS2, the contact electrodes CNE, and a fourth insulating layer INS4 that are sequentially disposed and/or formed on the circuit layer PCL.

For example, the bank pattern BNP may be disposed on the circuit layer PCL. The bank pattern BNP may be formed as a separate or integral pattern. The bank pattern BNP may protrude upward (for example, in a third direction (Z-axis direction)) on one surface of the substrate SUB. Accordingly, one area of the pixel electrode ELT disposed on each bank pattern BNP may protrude upward.

A reflective partition wall may be formed around the light-emitting elements LD due to the bank pattern BNP and the pixel electrodes ELT disposed thereon. As an example, when the pixel electrodes ELT includes a reflective electrode layer at least, light emitted from both end portions of the light-emitting elements LD may be reflected from the reflective electrode layer to be emitted in an upward direction of the each pixel PXL (for example, in the third direction (Z-axis direction)).

The bank pattern BNP may have various shapes. In one embodiment, as illustrated in FIGS. 10 and 11, the bank pattern BNP may be formed to have an inclined surface inclined at an angle in a range (e.g., a set or a predetermined range) with respect to the substrate SUB. In another embodiment, the bank pattern BNP may have a curved surface or sidewalls having a step shape. For example, the bank pattern BNP may have a cross section having a semicircular or semi-elliptical shape.

Electrodes and/or insulating layers disposed on the bank pattern BNP may have a shape corresponding to the bank pattern BNP. For example, each pixel electrode ELT may include an inclined surface or a curved surface having a shape corresponding to the shape of the bank pattern BNP around the light-emitting elements LD. However, the bank pattern BNP may be omitted according to some embodiments.

The pixel electrodes ELT of each pixel PXL may be disposed on the bank pattern BNP. According to some embodiments, each pixel electrode ELT may have a pattern separated for each pixel PXL. For example, each of the first to eighth electrodes ELT1 to ELT8 may have an independent pattern in which both ends thereof are disconnected in a peripheral area of the corresponding pixel area PXA and/or between adjacent pixel areas PXA. However, the present disclosure is not necessarily limited thereto, and at least one of the pixel electrodes ELT may have a pattern connected in common to the plurality of pixels PXL.

Each pixel electrode ELT may include at least one conductive material. Further, the pixel electrodes ELT may include the same conductive material or different conductive materials. Also, each pixel electrode ELT may be formed as a single-layer or multi-layer.

The first insulating layer INS1 may be disposed on one surface of the base layer BSL including the pixel electrodes ELT. In one embodiment, as illustrated in FIG. 10, the first insulating layer INS1 may have contact holes CH for electrically connecting the pixel electrodes ELT to the contact electrodes CNE. In another embodiment, as illustrated in FIG. 11, the first insulating layer INS1 may be opened more widely on the bank pattern BNP, and in opened areas of the first insulating layer INS1, the pixel electrodes ELT may be electrically connected to the contact electrodes CNE. In still another embodiment, the first insulating layer INS1 may be disposed locally only in areas between the pixel electrodes ELT and the light-emitting elements LD.

In one embodiment, the first insulating layer INS1 may be formed to primarily and entirely cover the first and second electrodes ELT1 and ELT2. After the light-emitting elements LD are supplied and aligned on the first insulating layer INS1, the first insulating layer INS1 may be partially opened to expose one areas of the pixel electrodes ELT. Because the pixel electrodes ELT are formed and then covered by the first insulating layer INS1 or the like, it is possible to prevent damage to the pixel electrodes ELT in a subsequent process.

The bank BNK may be disposed on the first insulating layer INS1. However, the position of the bank BNK in a cross-section is not limited thereto, and the bank BNK may be disposed to be coplanar with the above-described bank pattern BNP according to some embodiments. The light-emitting elements LD may be supplied and aligned in the emission areas SEA1 and SEA2 positioned in the bank BNK. The light-emitting elements LD may be supplied to the emission areas SEA1 and SEA2 of each pixel PXL through an inkjet method, a slit coating method, or other various methods, and the light-emitting elements LD may be aligned between the pixel electrodes ELT by applying an alignment signal (e.g., a set or predetermined alignment signal) (or alignment voltage) to each of alignment lines.

In one embodiment, at least some of the light-emitting elements LD may be disposed between one pair of pixel electrodes ELT such that both end portions (that is, first and second end portions EP1 and EP2) thereof in a length direction thereof overlap or do not overlap the one pair of pixel electrodes ELT adjacent thereto. Further, each of both end portions (that is, the first and second end portions EP1 and EP2) of the light-emitting elements LD may be in direct contact with the each pixel electrode ELT or may be electrically connected to each pixel electrode ELT through the contact electrode CNE.

The second insulating layer INS2 may be disposed on one areas of the light-emitting elements LD. The second insulating layer INS2 may be disposed on one area of each of the light-emitting elements LD so as to expose the first and second end portions EP1 and EP2 of each of the light-emitting elements LD. When the second insulating layer INS2 is formed on the light-emitting elements LD after the alignment of the light-emitting elements LD is completed, it is possible to prevent the light-emitting elements LD from being separated from the aligned position thereof.

As described above, in a process of supplying the light-emitting elements LD in the emission areas SEA1 and SEA2, the light-emitting elements LD may also be supplied to a second area NEA, and the light-emitting elements LD present in the second area may be separated in a subsequent process and cause short circuit defects and/or foreign material defects. Accordingly, in a display device according to one embodiment, the first insulating layer INS1 and the second insulating layer INS2 described above include a plurality of opening areas OPA (or openings OPA1 and OPA2 of FIG. 12) formed in the second area NEA, thereby preventing the separation of the light-emitting elements LD present in the second area NEA. For the detailed descriptions thereof, reference is made in FIG. 12.

Figure 12:
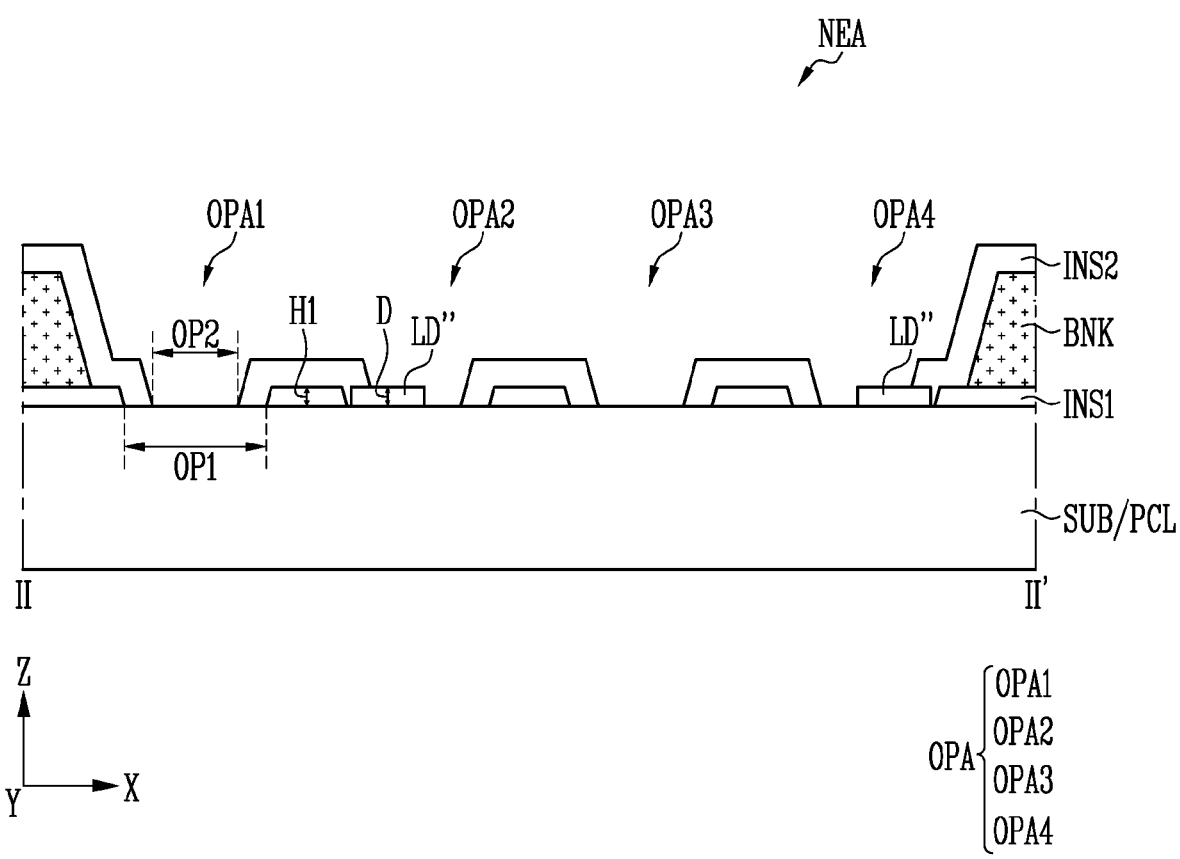
FIG. 12 is a cross-sectional view taken along the line II-II" of FIG. 9.

FIG. 12 is a cross-sectional view taken along the line II-II" of FIG. 9.

In FIG. 12, for convenience of description, a circuit layer PCL and the like are omitted, and only a bank BNK, first insulating layer INS1, and second insulating layer INS2 of a display layer DPL are illustrated.

Referring to FIG. 12, the first insulating layer INS1 and the second insulating layer INS2 may include a plurality of opening areas OPA disposed in a second area NEA. The opening areas OPA may include first to fourth opening areas OPA1 to OPA4 spaced from each other. The first to fourth opening areas OPA1 to OPA4 may be disposed along a first direction (X-axis direction) in the second area NEA. Widths of the first to fourth opening areas OPA1 to OPA4 in the first direction (X-axis direction) may be substantially the same but are not necessarily limited thereto.

The first insulating layer INS1 may include a first opening OP1 overlapping the opening area OPA in the third direction (e.g., Z-axis direction), and the second insulating layer INS2 may include a second opening OP2 overlapping the opening area OPA (or the first opening OP1) in the third direction (e.g., Z-axis direction). The first opening OP1 and the second opening OP2 may provide a space for separating each alignment line into a plurality of pixel electrodes ELT after light-emitting elements LD are aligned. While in a process of aligning the light-emitting elements LD in a first area SEA (or first and second emission areas SEA1 and SEA2), ineffective light-emitting elements LD" may also be disposed in the opening area OPA of the second area NEA (or the first opening OP1 of the first insulating layer INS1). The ineffective light-emitting elements LD" may be substantially the same as the light-emitting elements LD/LD' described with reference to FIGS. 1-11 but may be ineffective light sources in a non-emission state. As described above, in order to prevent the ineffective light-emitting elements LD" present in the second area NEA from being separated in a subsequent process to cause short circuit defects and/or foreign material defects, the ineffective light-emitting elements LD" may be fixed by the second insulating layer INS2. To this end, a width of the second opening OP2 of the second insulating layer INS2 in the first direction (X-axis direction) may be smaller than a width of the first opening OP1 of the first insulating layer INS1 in the first direction (X-axis direction). In this case, the second insulating layer INS2 may cover a sidewall of the first opening OP1. When the ineffective light-emitting element LD" is present in the first opening OP1, the second insulating layer INS2 may at least partially cover and fix the ineffective light-emitting element LD", thereby preventing the ineffective light-emitting elements LD" from being separated in a subsequent process to cause short circuit defects and/or foreign material defects. Further, in order to more easily fix the ineffective light-emitting element LD", a thickness H1 of the first insulating layer INS1 may be substantially the same as a diameter D of the ineffective light-emitting element LD" but is not necessarily limited thereto.

Referring again to FIGS. 10 and 11, both end portions of the light-emitting elements LD not covered by the second insulating layer INS2, that is, first and second end portions EP1 and EP2, may be covered by contact electrodes CNE and may be electrically connected to the pixel electrodes ELT through the contact electrodes CNE.

In one embodiment, as illustrated in FIG. 10, two contact electrodes CNE (for example, first and second contact electrodes CNE1 and CNE2) facing (or opposite) each other with the light-emitting elements LD interposed therebetween may be disposed to be coplanar with each other. When the contact electrodes CNE are formed to be coplanar with each other, the contact electrodes CNE may be formed concurrently or sequentially in the same process. In this case, it is possible to simplify a manufacturing process of the pixel PXL and a display device including the same. In another embodiment, as illustrated in FIG. 11, two contact electrodes CNE (for example, the first and second contact electrodes CNE1 and CNE2) facing (or opposite) each other with the light-emitting elements LD interposed therebetween may be separated and disposed on different layers. In this case, a display layer DPL may further include a third insulating layer INS3 interposed between the contact electrodes CNE. The third insulating layer INS3 may be disposed to cover one of one pair of contact electrodes CNE (for example, the first contact electrode CNE1). When the second and/or third insulating layers INS2 and INS3 are formed on the light-emitting elements LD, it is possible to secure electrical stability between the first end portions EP1 and the second end portions EP2 of the light-emitting elements LD. For example, one pair of adjacent contact electrodes CNE may be stably separated by the second and/or third insulating layers INS2 and INS3. Accordingly, it is possible to prevent or reduce the occurrence of short circuit defects between the first end portions EP1 and the second end portions EP2 of the light-emitting elements LD.

The contact electrodes CNE may be made of various transparent conductive materials. As an example, the contact electrodes CNE may include at least one selected from various transparent conductive materials such as ITO, IZO, ITZO, ZnO, AZO, GZO, ZTO, GTO, and FTO and may be implemented to be substantially transparent or semi-transparent so as to satisfy a suitable transmittance (e.g., a set or predetermined transmittance). Accordingly, light emitted from the light-emitting elements LD through the first and second end portions EP1 and EP2 may pass through the contact electrodes CNE to be emitted to the outside of the pixel PXL.

A fourth insulating layer INS4 may be disposed on the contact electrodes CNE and/or the second and/or third insulating layers INS2 and INS3. For example, the fourth insulating layer INS4 may be entirely formed on the substrate SUB to cover the bank pattern BNP, the pixel electrodes ELT, the plurality of insulating layers INS1, INS2, and INS3, the light-emitting elements LD, the contact electrodes CNE, and/or the bank BNK. The fourth insulating layer INS4 may include at least one layer of an inorganic film and/or organic film. According to some embodiments, the fourth insulating layer INS4 may include a thin film encapsulation layer having a multi-layered structure. For example, the fourth insulating layer INS4 may include a thin film encapsulation layer having a multi-layered structure, which includes at least two inorganic insulating layers and at least one organic insulating layer interposed between the at least two inorganic insulating layers. However, the structural material and/or structure of the fourth insulating layer INS4 are not limited thereto, and according to some embodiments, at least one overcoat layer, a filler layer, and/or an upper substrate may be further disposed on the fourth insulating layer INS4.

According to the above-described embodiment, in a process of aligning the light-emitting elements LD in the first area SEA (or first and second emission areas SEA1 and SEA2), even when the ineffective light-emitting elements LD" are supplied in the second area NEA, the ineffective light-emitting elements LD" may be disposed in the first opening OP1 of the first insulating layer INS1 and fixed by the second insulating layer INS2 covering the sidewall of the first opening OP1. Therefore, it is possible to prevent the ineffective light-emitting elements LD" from being separated in a subsequent process to cause short circuit defects and/or foreign material defects.

Hereinafter, other embodiments will be described. In the following embodiments, the same components as the above-described components will be denoted by the same reference numerals, and repetitive descriptions thereof will be omitted or simplified.

Figure 13:
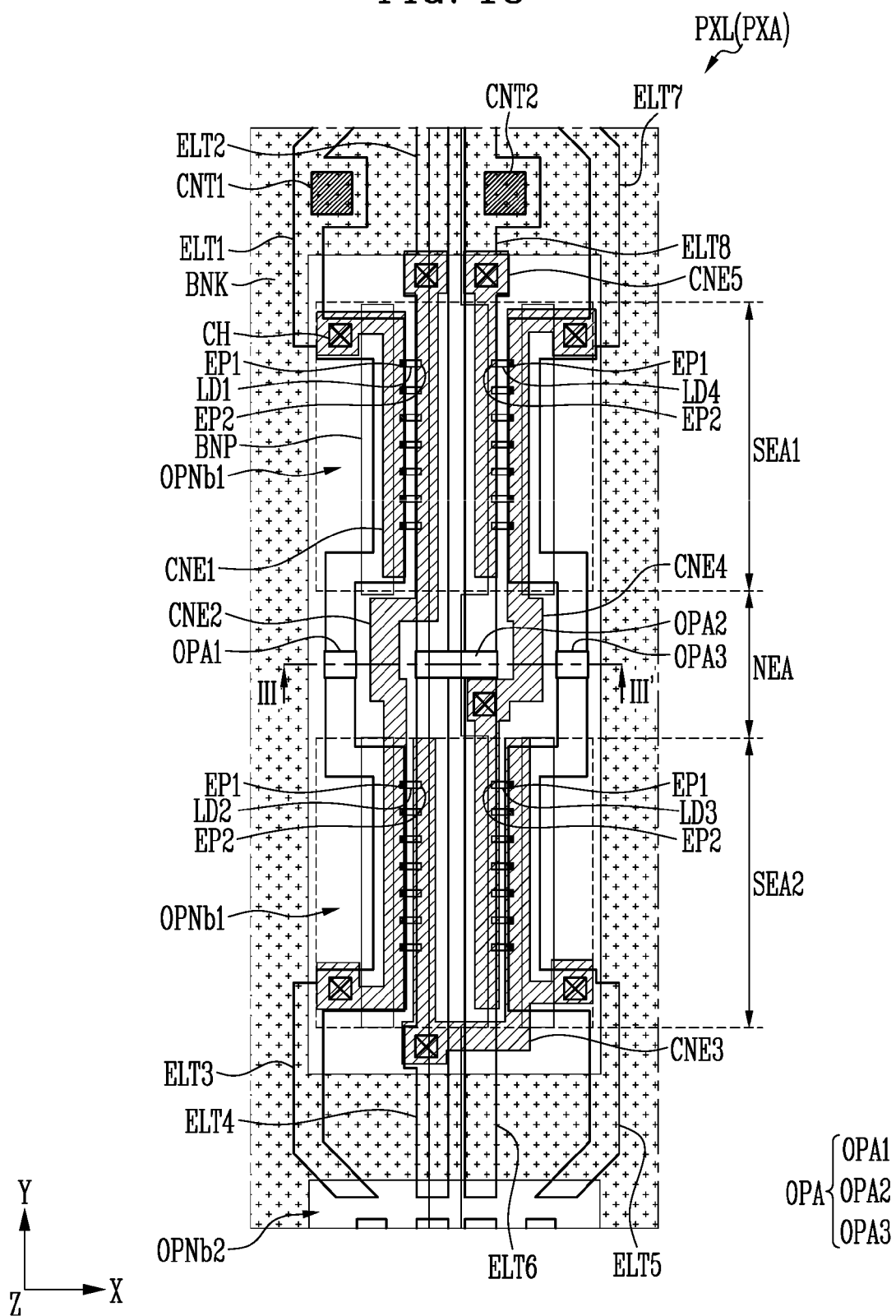
FIG. 13 is a plan view illustrating a pixel according to another embodiment.
Figure 14:
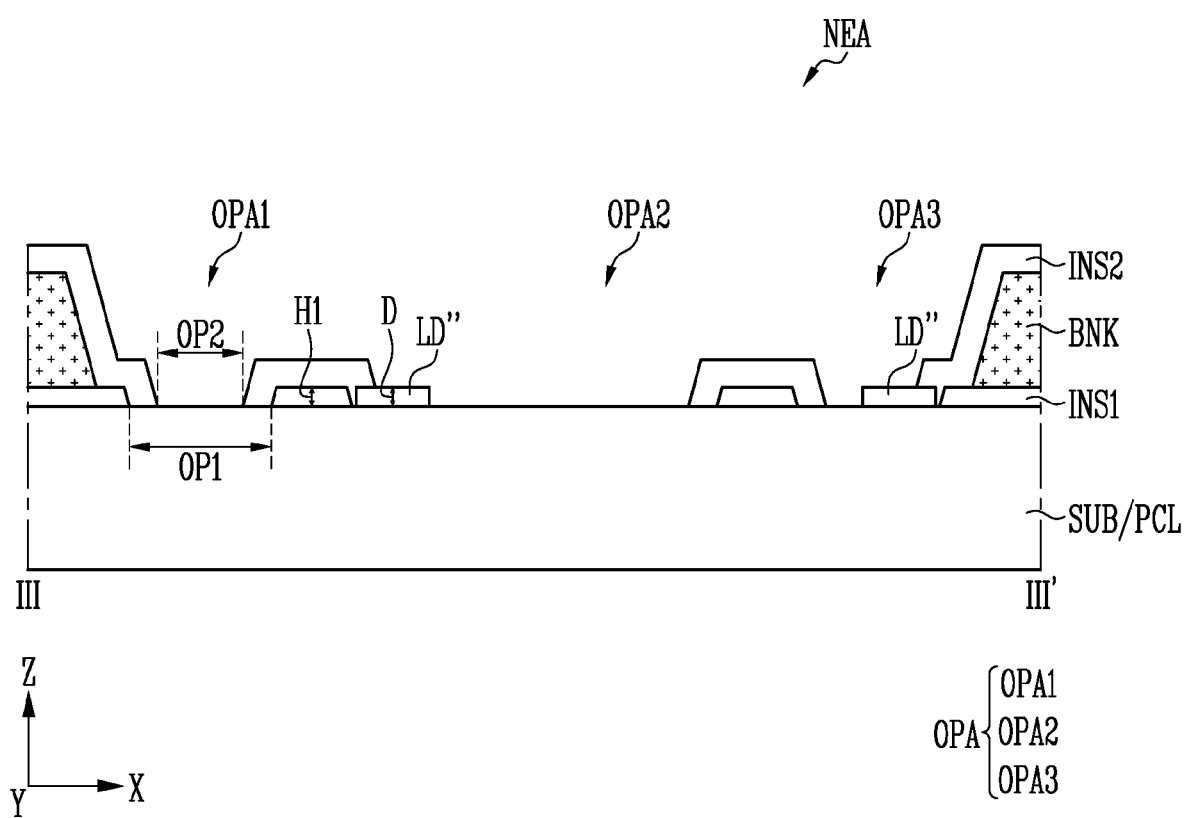
FIG. 14 is a cross-sectional view taken along the line III-III' of FIG. 13.

FIG. 13 is a plan view illustrating a pixel according to another embodiment. FIG. 14 is a cross-sectional view taken along the line III-III' of FIG. 13. FIG. 14 may correspond to a cross section at substantially the same position as that of FIG. 12.

Referring to FIGS. 13 and 14, a second area NEA may include an opening area OPA for separating alignment lines into a plurality of pixel electrodes ELT. The opening areas OPA may include first to third opening areas OPA1 to OPA3 spaced from each other along the first direction (e.g., X-axis direction). The first to third opening areas OPA1 to OPA3 may be disposed in a first direction (X-axis direction) in the second area NEA. The first to third opening areas OPA1 to OPA3 may have different sizes. For example, in a process of separating the alignment lines, the first opening area OPA1 may overlap one alignment line, the second opening area OPA2 may overlap the plurality of alignment lines, and the third opening area OPA3 may be formed to overlap one alignment line. That is, a width of the second opening area OPA2 in the first direction (X-axis direction) may be greater than a width of the first opening area OPA1 and/or the third opening area OPA3 in the first direction (X-axis direction).

The first opening area OPA1 may be disposed between a first electrode ELT1 and a third electrode ELT3. That is, the first electrode ELT1 and the third electrode ELT3 may be spaced from each other with the first opening area OPA1 interposed therebetween. A width of the first opening area OPA1 in the first direction (X-axis direction) may be greater than a width of each of the first electrode ELT1 and/or the third electrode ELT3 in the first direction (X-axis direction), but the present disclosure is not necessarily limited thereto.

The second opening area OPA2 may be disposed between a second electrode ELT2 and a fourth electrode ELT4 and between an eighth electrode ETL8 and a sixth electrode ELT6. That is, the second electrode ELT2 and the fourth electrode ELT4 may be spaced from each other with the second opening area OPA2 interposed therebetween. Further, the eighth electrode ETL8 and the sixth electrode ELT6 may be spaced from each other with the second opening area OPA2 interposed therebetween. A width of the second opening area OPA2 in the first direction (X-axis direction) may be greater than a width in the first direction (X-axis direction) from one side of the second electrode ELT2 to the other side of the eighth electrode ELT8. Similarly, the width of the second opening area OPA2 in the first direction (X-axis direction) may be greater than a width in the first direction (X-axis direction) from one side of the fourth electrode ELT4 to the other side of the sixth electrode ELT6.

The third opening area OPA3 may be disposed between a fifth electrode ELT5 and a seventh electrode ELT7. That is, the fifth electrode ELT5 and the seventh electrode ELT7 may be spaced from each other with the third opening area OPA3 interposed therebetween. A width of the third opening area OPA3 in the first direction (X-axis direction) may be greater than a width of each of the fifth electrode ELT5 and/or the seventh electrode ELT7 in the first direction (X-axis direction), but the present disclosure is not necessarily limited thereto.

A first insulating layer INS1 may include a first opening OP1 overlapping the opening area OPA in the third direction (e.g., Z-axis direction), and a second insulating layer INS2 may include a second opening OP2 overlapping the opening area OPA (or the first opening OP1) in the third direction (e.g., Z-axis direction). The first opening OP1 and the second opening OP2 may provide a space for separating each alignment line into the plurality of pixel electrodes ELT after light-emitting elements LD are aligned. Meanwhile, in a process of aligning the light-emitting elements LD in a first area SEA (or first and second emission areas SEA1 and SEA2), ineffective light-emitting elements LD" may also be disposed in the opening area OPA of the second area NEA (or the first opening OP1 of the first insulating layer INS1). As described above, in order to prevent the ineffective light-emitting elements LD" present in the second area from being separated in a subsequent process to cause short circuit defects and/or foreign material defects, the ineffective light-emitting elements LD" may be fixed by the second insulating layer INS2. To this end, a width of the second opening OP2 of the second insulating layer INS2 in the first direction (X-axis direction) may be smaller than a width of the first opening OP1 of the first insulating layer INS1 in the first direction (X-axis direction). In this case, the second insulating layer INS2 may cover a sidewall of the first opening OP1. Even when the ineffective light-emitting elements LD" are supplied in the second area NEA, the ineffective light-emitting elements LD" may be disposed in the first opening OP1 of the first insulating layer INS1 and fixed by the second insulating layer INS2 covering the sidewall of the first opening OP1. Therefore, it is possible to prevent the ineffective light-emitting elements LD" from being separated in a subsequent process to cause short circuit defects and/or foreign material defects as described above.

Figure 15:
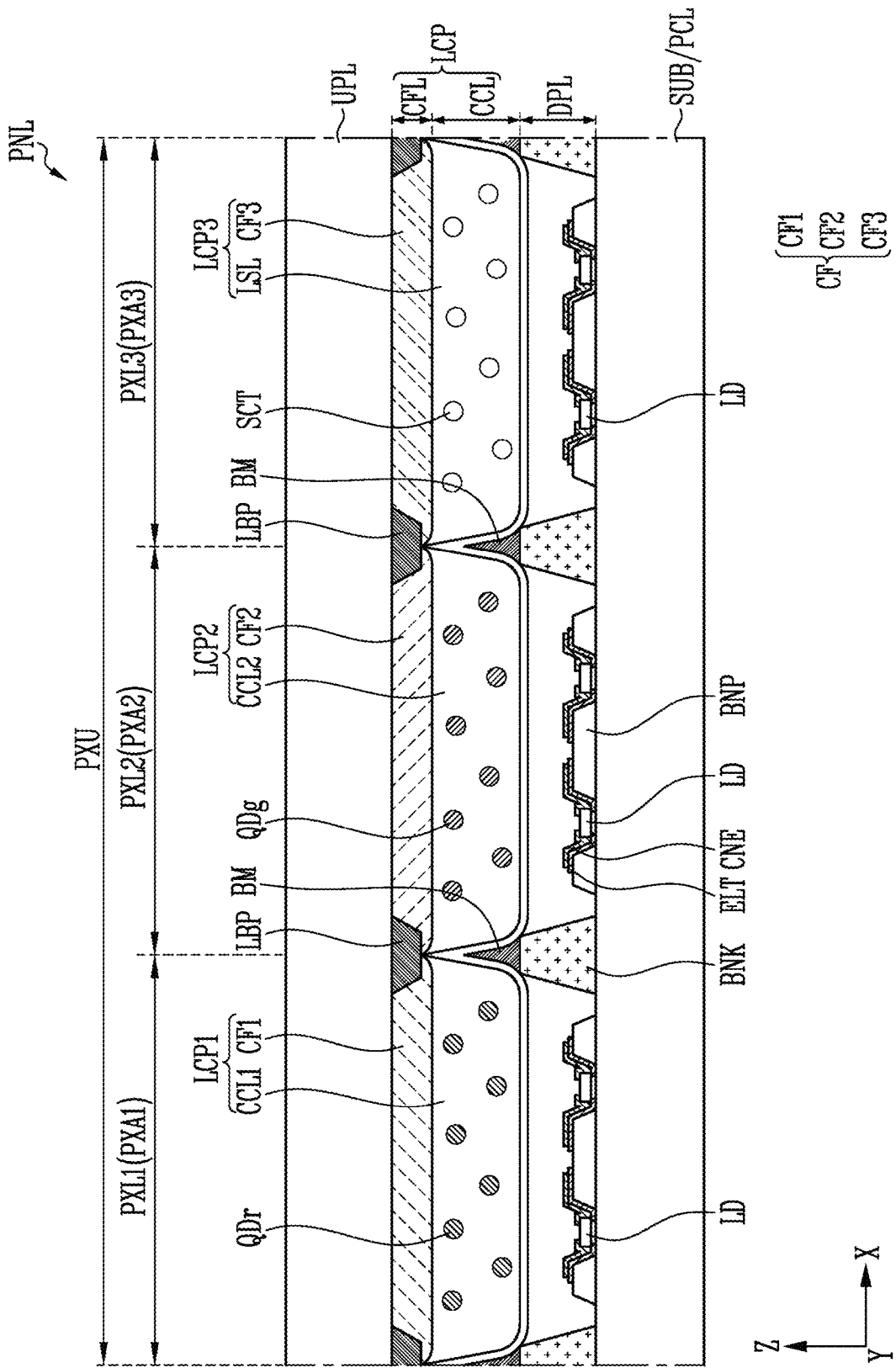
FIG. 15 is a cross-sectional view illustrating a display device according to still another embodiment.

FIG. 15 is a cross-sectional view illustrating a display device according to still another embodiment. FIG. 15 illustrates a cross section of a display panel PNL based on an area in which one pixel unit PXU including a first pixel PXL1, a second pixel PXL2, and a third pixel PXL3 adjacent to each other is disposed. Because each of pixels PXL has been described in detail through the above-described embodiments, in FIG. 15, the structure of each pixel PXL is schematically illustrated based on pixel electrodes ELT, light-emitting elements LD, and contact electrodes CNE, and detailed descriptions thereof will be omitted.

Referring to FIG. 15, the display device according to the present embodiment may further include an upper substrate UPL disposed on a display layer DPL. For example, the upper substrate UPL (also referred to as "encapsulation substrate" or "color filter substrate") encapsulating a display area DA may be disposed on one surface of a substrate SUB on which the pixels PXL are disposed.

The upper substrate UPL may include a light control layer LCP overlapping the pixels PXL in the third direction (e.g., Z-axis direction). The light control layer LCP may include a first light control layer LCP1 disposed on the first pixel PXL1, a second light control layer LCP2 disposed on the second pixel PXL2, and a third light control layer LCP3 disposed on the pixel PXL3. Each of the first, second, and third light control layers LCP1, LCP2, and LCP3 may include a color conversion layer CCL and/or a color filter layer CFL which correspond to a suitable color (e.g., a set or predetermined color).

In one embodiment, the first pixel PXL1, the second pixel PXL2, and the third pixel PXL3 may be a red pixel, a green pixel, and a blue pixel, respectively. According to some embodiments, the first to third pixels PXL1, PXL2, and PXL3 may include the light-emitting elements LD that emit light having the same color light. For example, the light-emitting elements LD may be blue light-emitting elements that emit blue light at a wavelength of about 400 nm to 500 nm. In this case, because the light control layer LCP including at least one type of color conversion particles is disposed on at least some pixels PXL from among the first, second and third pixels PXL1, PXL2, and PXL3, the full-color pixel unit PXU can be implemented. However, the present disclosure is not necessarily limited thereto, and the first to third pixels PXL1, PXL2, and PXL3 may include the light-emitting elements LD that emit light having different colors. For example, the first pixel PXL1, the second pixel PXL2, and the third pixel PXL3 may include a first color light-emitting element, a second color light-emitting element, and a third color light-emitting element, respectively. As an example, the first color light-emitting element may be a red light-emitting element that emits red light, the second color light-emitting element may be a green light-emitting element that emits green light, and the third color light-emitting element may be a blue light-emitting element that emits blue light.

The first light control layer LCP1 may be disposed on the first pixel PXL1 and may include at least one of a first color conversion layer CCL1 that includes first conversion particles and a first color filter CF1 that selectively transmits the first color light. The first color conversion layer CCL1 may be disposed between the light-emitting element LD and the first color filter CF1.

The first color conversion layer CCL1 may convert light emitted from the light-emitting elements LD. To this end, the first color conversion layer CCL1 may be disposed between the light-emitting elements LD and the first color filter CF1 and may include the first color conversion particles. As an example, when the light-emitting elements LD disposed in the first pixel PXL1 are blue light-emitting elements configured to emit blue light and the first pixel PXL1 is a red pixel, the first color conversion layer CCL1 may include red quantum dots QDr that convert the blue light emitted from the light-emitting elements LD. The red quantum dots QDr may be dispersed in a matrix material (e.g., a set or predetermined matrix material) such as a transparent resin. The red color quantum dots QDr may absorb blue light and shift a wavelength according to an energy transition to emit red light at a wavelength of about 620 nm to 780 nm. When the first pixel PXL1 is a different color pixel, the first color conversion layer CCL1 may include first quantum dots corresponding to a color of the first pixel PXL1.

The second light control layer LCP2 may be disposed on the second pixel PXL2 and may include at least one of a second color conversion layer CCL2 that includes second conversion particles and a second color filter CF2 that selectively transmits the second color light. The second color conversion layer CCL2 may be disposed between the light-emitting element LD and the second color filter CF2.

The second color conversion layer CCL2 may convert light emitted from the light-emitting elements LD. To this end, the second color conversion layer CCL2 may be disposed between the light-emitting elements LD and the second color filter CF2 and may include the second color conversion particles. As an example, when the light-emitting elements LD disposed in the second pixel PXL2 are blue light-emitting elements configured to emit blue light and the second pixel PXL2 is a green pixel, the second color conversion layer CCL2 may include green color quantum dots QDg that convert the blue light emitted from the light-emitting elements LD into green light. The green quantum dots QDg may be dispersed in a matrix material (e.g., a set or predetermined matrix material) such as a transparent resin. The green quantum dots QDg may absorb blue light and shift a wavelength according to an energy transition to emit green light at a wavelength of about 500 nm to about 570 nm. When the second pixel PXL2 is a different color pixel, the second color conversion layer CCL2 may include second quantum dots corresponding to a color of the second pixel PXL2.

The third light control layer LCP3 may include at least one of a light scattering layer LSL that includes light scattering particles SCT and a third color filter CF3 that selectively transmits third color light. The light scattering layer LSL may be disposed between the light-emitting element LD and the third color filter CF3. The light scattering layer LSL may be omitted according to some embodiments. As an example, when the light-emitting elements LD disposed in the third pixel PXL3 are blue light-emitting elements configured to emit blue light and the third pixel PXL3 is a blue pixel, the light scattering layer LSL may be selectively provided in order to efficiently utilize light emitted from the light-emitting elements LD. The light scattering layer LSL may include at least one type of the light scattering particles SCT. The light scattering particles SCT may be dispersed in a matrix material (e.g., a set or predetermined matrix material). As an example, the light scattering layer LSL may include the light scattering particles SCT of titanium dioxide ($TiO_2$) or silica, but the present disclosure is not limited thereto.

According to some embodiments, a pattern capable of blocking light may be additionally disposed between the light scattering layer LSL, the first color conversion layer CCL1, and the second color conversion layer CCL2. For example, a black matrix pattern BM may be disposed between the light scattering layer LSL, the first color conversion layer CCL1, and the second color conversion layer CCL2. According to some embodiments, a light blocking pattern LBP may be disposed between the color filters CF. For example, the light blocking pattern LBP may be disposed on one surface of the upper substrate UPL to face the bank BNK and may overlap an edge of each of the first to third color filters CF1, CF2, and CF3. The light blocking pattern LBP may include at least one black matrix material (for example, at least one light blocking material currently known) selected from various types of black matrix materials, and/or a color filter material of a specific color. Further, the light blocking pattern LBP may be made of the same material as the bank BNK, but the present disclosure is not limited thereto. That is, the light blocking pattern LBP and the bank BNK may include the same material or different materials. The light blocking pattern LBP may be omitted according to some embodiments. In this case, the first to third color filters CF1, CF2, and CF3 may be disposed to overlap each other at a boundary between pixel areas PXA and to serve to block light.

While the display panel PNL is illustrated in the embodiment of FIG. 15 as having a structure in which the light scattering layer LSL, the first color conversion layer CCL1, and the second color conversion layer CCL2 are first formed on one surface of the upper substrate UPL, and then, the black matrix pattern BM is formed between the light scattering layer LSL, the first color conversion layer CCL1, and the second color conversion layer CCL2, the order of forming the black matrix pattern BM may be changed. For example, the black matrix pattern BM may be first formed on one surface of the upper substrate UPL on which the color filter CF and the like are disposed, and the light scattering layer LSL, the first color conversion layer CCL1, and/or the second color conversion layer CCL2 may be formed in areas partitioned by the black matrix pattern BM.

In one embodiment, in order for light emitted from the light-emitting elements LD to be smoothly emitted in an upward direction of the pixels PXL, a filler (e.g., a set or predetermined filler) having a relatively low refractive index may fill a space between a lower plate of the display panel PNL including the substrate SUB and the display layer DPL and an upper plate of the display panel PNL including the upper substrate UPL and the light control layer LCP. In another embodiment, the space between the lower plate and the upper plate of the display panel PNL may be filled with an air layer.

According to the above-described embodiment, blue light having a relatively short wavelength in a visible light region may be incident on each of the green quantum dots QDg and the red quantum dots QDr, thereby increasing an absorption coefficient of the green quantum dots QDg and the red quantum dots QDr. Accordingly, efficiency of light emitted from the first and second pixels PXL1 and PXL2 can be increased, and excellent color reproducibility can also be secured. Further, when the light-emitting units EMU of the first, second, and third pixels PXL1, PXL2, and PXL3 are formed using the same color light-emitting elements LD (for example, the blue light-emitting elements LD), it is possible to increase the manufacturing efficiency of the display device.

Figure 16:
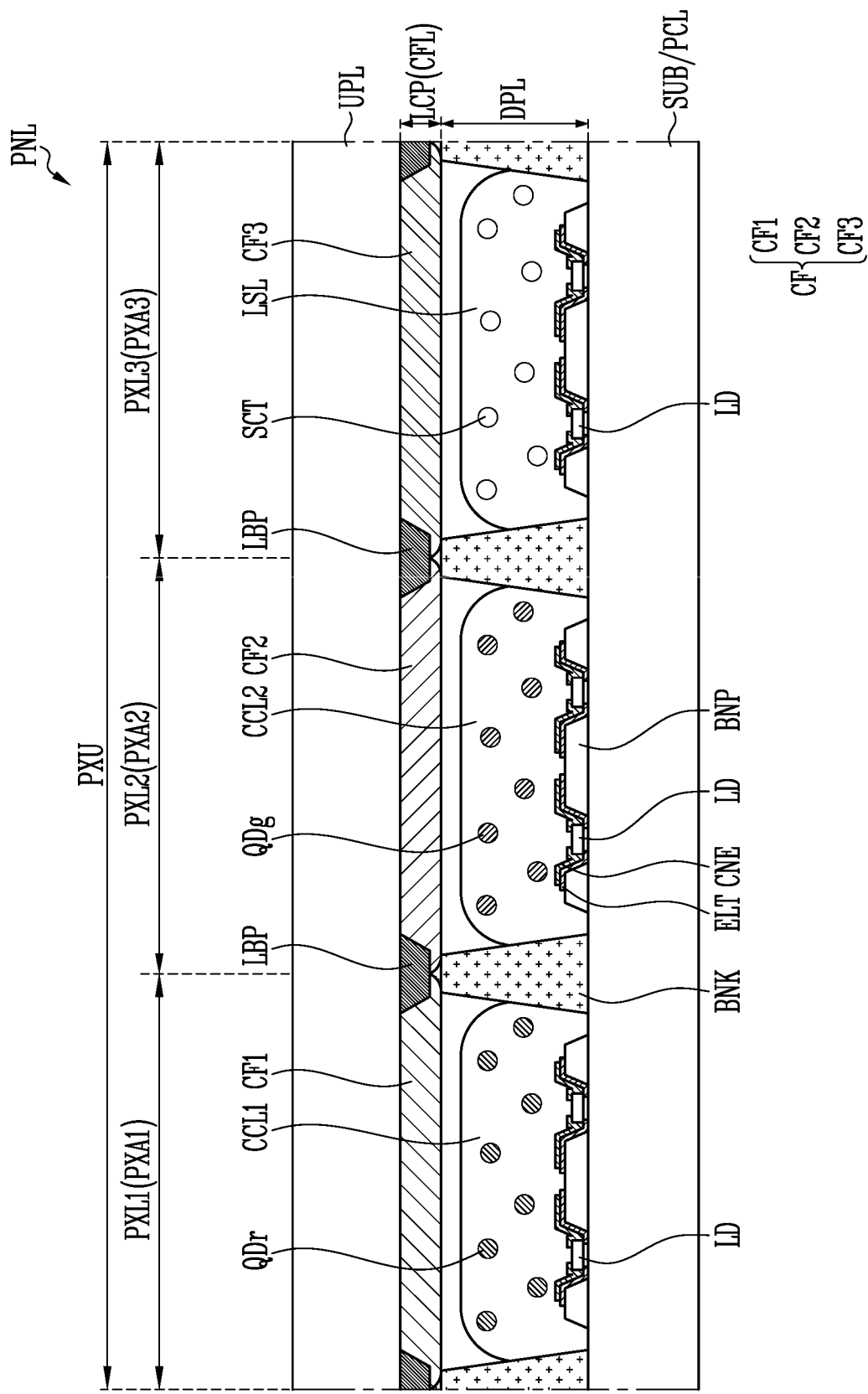
FIG. 16 is a cross-sectional view illustrating a display device according to another embodiment.

FIG. 16 is a cross-sectional view illustrating a display device according to yet another embodiment.

Referring to FIG. 16, the display device according to the present embodiment is different from the embodiment of FIG. 15 in that a light scattering layer LSL, a first color conversion layer CCL1, and a second color conversion layer CCL2 are formed on a substrate SUB on which pixels PXL are formed.

For example, the light scattering layer LSL, the first color conversion layer CCL1, and the second color conversion layer CCL2 may be disposed in areas partitioned by banks BNK on the substrate SUB. For example, the pixels PXL may be partitioned by a bank BNK, and the light scattering layer LSL, the first color conversion layer CCL1, and the second color conversion layer CCL2 may be disposed in the pixels PXL. The first color conversion layer CCL1 may be disposed in a first pixel PXL1, the second color conversion layer CCL2 may be disposed in a second pixel PXL2, and the light scattering layer LSL may be disposed in a third pixel PXL3. That is, the bank BNK may serve as a dam structure that defines the pixels PXL to which the light scattering layer LSL, the first color conversion layer CCL1, and the second color conversion layer CCL2 are to be supplied in a process of forming the light scattering layer LSL, the first color conversion layer CCL1, and the second color conversion layer CCL2.

An upper substrate UPL may be disposed on the light scattering layer LSL, the first color conversion layer CCL1, and the second color conversion layer CCL2. The upper substrate UPL may include a color filter layer CFL overlapping the pixels PXL. The color filter layer CFL may include a first color filter CF1 disposed on a first pixel PXL1, a second color filter CF2 disposed on a second pixel PXL2, a third color filter CF3 disposed on a third pixel PXL3, and a light blocking pattern LBP disposed between the color filters CF.

In one embodiment, in order for light emitted from light-emitting elements LD to be smoothly emitted in an upward direction of the pixels PXL, a filler (e.g., a set or predetermined filler) having a relatively low refractive index may fill a space between a lower plate of the display panel PNL including the substrate SUB, a display layer DPL, the light scattering layer LSL, the first color conversion layer CCL1, and the second color conversion layer CCL2 and an upper plate of the display panel PNL including the upper substrate UPL and the color filter layer CFL. In another embodiment, the space between the lower plate and the upper plate of the display panel PNL may be filled with an air layer.

As described above, when the light scattering layer LSL, the first color conversion layer CCL1, and the second color conversion layer CCL2 are formed directly on the display layer DPL including the light-emitting elements LD, it is possible to improve the luminous efficiency of the pixels PXL.

Figure 17:
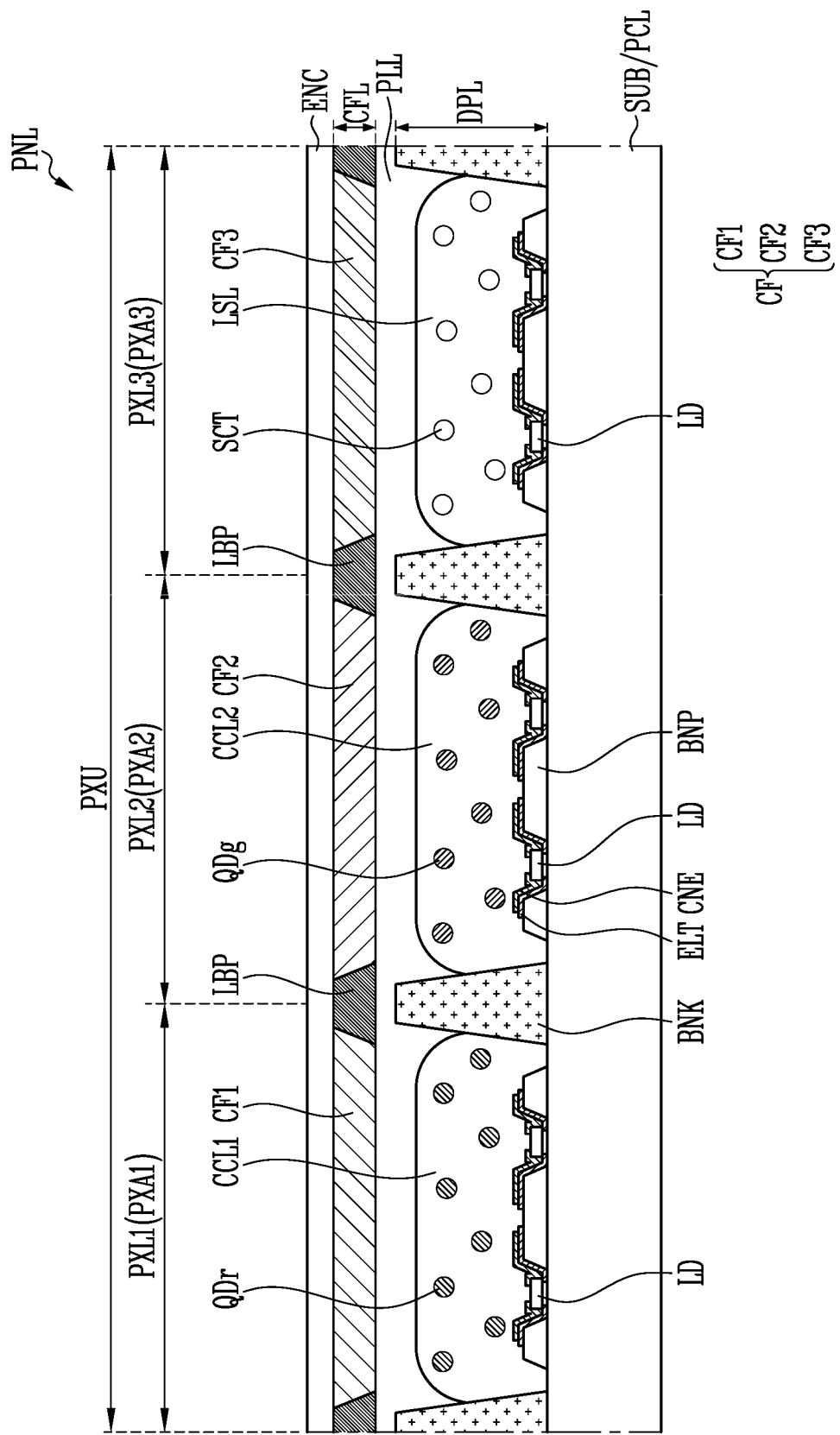
FIG. 17 is a cross-sectional view illustrating a display device according to another embodiment.

FIG. 17 is a cross-sectional view of a display device according to yet another embodiment.

Referring to FIG. 17, the display device according to the present embodiment is different from the embodiments of FIGS. 15 and 16 in that a light scattering layer LSL, a first color conversion layer CCL1, and a second color conversion layer CCL2 as well as a color filter layer CFL are formed on a substrate SUB on which pixels PXL are formed.

For example, the light scattering layer LSL, the first color conversion layer CCL1, and the second color conversion layer CCL2 may be disposed in areas partitioned by banks BNK on the substrate SUB. The arrangement of the light scattering layer LSL, the first color conversion layer CCL1, and the second color conversion layer CCL2 has been described with reference to FIG. 16, and thus, repetitive descriptions thereof will be omitted.

A planarization layer PLL may be disposed on the light scattering layer LSL, the first color conversion layer CCL1, and the second color conversion layer CCL2. The planarization layer PLL may be disposed over first to third pixels PXL1, PXL2, and PXL3 so as to cover the light scattering layer LSL, the first color conversion layer CCL1, and the second color conversion layer CCL2. A capping layer may be further disposed between the planarization layer PLL, and the light scattering layer LSL, the first color conversion layer CCL1, and the second color conversion layer CCL2. The capping layer may be an inorganic layer and may be made of at least one selected from silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), and silicon oxynitride ($SiO_xN_y$).

According to some embodiments, the planarization layer PLL may be formed as a single-layer or multi-layer including at least one layer of an organic film. For example, the planarization layer PLL may have a refractive index relatively lower than that of the light scattering layer LSL, the first color conversion layer CCL1, and the second color conversion layer CCL2, thereby serving to improve luminous efficiency of the pixel PXL.

The color filter layer CFL may be disposed on the planarization layer PLL. The color filter layer CFL may include first, second, and third color filters CF1, CF2, and CF3 respectively disposed on the first to third pixels PXL1, PXL2, and PXL3, and a light blocking pattern LBP disposed between the color filters CF.

An encapsulation layer ENC may be disposed on the color filter layer CFL. The encapsulation layer ENC may cover the color filter layer CFL, the light scattering layer LSL, the first color conversion layer CCL1, the second color conversion layer CCL2, a display layer DPL, and a circuit layer PCL disposed thereunder. The encapsulation layer ENC may prevent moisture or air from permeating into the above-described members disposed thereunder. To this end, the encapsulation layer ENC may include at least one inorganic layer. For example, the inorganic layer may include at least one selected from silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), and silicon oxynitride ($SiO_xN_y$), but the present disclosure is not necessarily limited thereto. Further, the encapsulation layer ENC may protect the above-describes members disposed thereunder from foreign materials such as dust. To this end, the encapsulation layer ENC may include at least one organic layer. For example, the organic layer may be made of an acrylic resin, an epoxy resin, a phenolic resin, a polyamide resin, or a polyimide resin, but the present disclosure is not necessarily limited thereto. According to some embodiments, a sensing layer for detecting a user's input may be further disposed on the encapsulation layer ENC.

As described above, when the light scattering layer LSL, the first color conversion layer CCL1, the second color conversion layer CCL2, and the color filter layer CFL are formed directly on the display layer DPL including light-emitting elements LD, a separate upper substrate may be omitted to reduce or minimize the thickness of a display panel PNL, thereby improving luminous efficiency.

According to some embodiments of the present disclosure, an emission area of a pixel can be secured by increasing or maximizing a bank opening area of the pixel. Further, even when ineffective light-emitting elements are supplied to a second area, which is a non-emission area in a bank opening, the ineffective light-emitting elements may be disposed in an opening of a first insulating layer and fixed by a second insulating layer. Accordingly, it is possible to prevent the ineffective light-emitting elements from being separated in a subsequent process to cause short circuit defects and/or foreign material defects.

Effects and aspects of the embodiments of the present disclosure are not limited to the embodiments set forth herein and more diverse effects and aspects are included in the present disclosure.

It will be apparent to those skilled in the art to which the embodiments of the present disclosure pertain that a variety of modifications are possible without departing from the essential characteristics of the present disclosure. Therefore, the above-described methods shall be interpreted as being illustrative while not being limitative. It should be understood that the scope of the present disclosure shall be defined by the appended claims and all of their equivalents fall within the scope of the present disclosure.

What is claimed is:

1. A display device comprising a plurality of pixels, each of the pixels including a first area and a second area and comprising:
    a first electrode and a second electrode in the first area, the first electrode being spaced from the second electrode in a first direction that is perpendicular to a second direction along a thickness of the display device;
    a plurality of first light-emitting elements located between the first electrode and the second electrode in the first area, the plurality of first light-emitting elements being overlapping and electrically connected to the first electrode and the second electrode;
a first insulating layer in the first area and the second area, the first insulating layer being on the first and second electrodes; and
a second insulating layer on the first insulating layer,
wherein the first insulating layer includes a first opening in the second area, the second area being a non-emission area of the display device,
wherein the second insulating layer includes a second opening overlapping the first opening, the first opening in the non-emission area having a second light-emitting element different from the plurality of first light-emitting elements,
wherein the second light-emitting element has a same structure as at least one of the plurality of first light-emitting elements, and wherein the second light-emitting element is spaced from and electrically isolated from the first electrode and the second electrode; and
wherein a width of the first opening in the first direction is greater than a width of the second opening in the first direction.

2. The display device of claim 1, further comprising a bank surrounding the first area and the second area.

3. The display device of claim 1, wherein the first area includes a first emission area and a second emission area, and
the second area is located between the first emission area and the second emission area.

4. The display device of claim 3, wherein the second area is located between two first areas arranged along the second direction.

5. The display device of claim 1, wherein the second light-emitting element is an ineffective light-emitting element in the second area.

6. The display device of claim 5, wherein the first light-emitting elements are effective light sources, and the ineffective light-emitting element is an ineffective light source.

7. The display device of claim 5, wherein the second insulating layer at least partially covers the ineffective light-emitting element.

8. The display device of claim 5, wherein the ineffective light-emitting element is in the first opening.

9. A display device comprising:
a first emission area, a second emission area, and a non-emission area located between the first emission area and the second emission area;
a first electrode and a second electrode in the first emission area;
a plurality of first light-emitting elements located between the first electrode and the second electrode, the plurality of first light-emitting elements being overlapping and electrically connected to the first electrode and the second electrode;
a third electrode and a fourth electrode in the second emission area;
a plurality of second light-emitting elements located between the third electrode and the fourth electrode;
at least one contact electrode electrically connecting one of the first electrode and the second electrode and one of the third electrode and the fourth electrode; and
an insulating layer in the first emission area, the second emission area, and the non-emission area, the insulating layer being on the first and second electrodes,
wherein the insulating layer includes an opening area in the non-emission area,
wherein a third light-emitting element is in the opening area in the non-emission area, wherein the third light-emitting element has a same structure as at least one of the plurality of first light-emitting elements or the plurality of second light-emitting elements, and wherein the third light-emitting element is spaced from and electrically isolated from the first electrode and the second electrode.

10. The display device of claim 9, wherein the opening area includes:
a first opening area between the first electrode and the third electrode; and
a second opening area between the second electrode and the fourth electrode.

11. The display device of claim 10, wherein a width of the first opening area in a first direction is greater than a width of the second opening area in the first direction.

12. The display device of claim 9, wherein the plurality of first light-emitting elements and the plurality of second light-emitting elements are connected in series.

13. The display device of claim 9, wherein the insulating layer comprises:
a first insulating layer; and
a second insulating layer on the first insulating layer.

14. The display device of claim 13, wherein the first insulating layer includes a first opening overlapping the opening area, and
the second insulating layer includes a second opening overlapping the first opening.

15. The display device of claim 14, wherein a width of the first opening in a first direction is greater than a width of the second opening in the first direction.

16. The display device of claim 14, wherein the third light-emitting element comprises an ineffective light-emitting element in the opening area.

17. The display device of claim 16, wherein the plurality of first light-emitting elements and the plurality of second light-emitting elements are effective light sources, and
the ineffective light-emitting element is an ineffective light source.

18. The display device of claim 16, wherein the second insulating layer at least partially covers the ineffective light-emitting element.

19. The display device of claim 16, wherein the ineffective light-emitting element is in the first opening.

20. The display device of claim 9, further comprising a bank surrounding the first emission area, the second emission area, and the non-emission area.

* * * * *